US012653035B2

(12) United States Patent     (10) Patent No.:   US 12,653,035 B2

Song et al.      (45) Date of Patent:     Jun. 9, 2026

(54) SEMICONDUCTOR PACKAGE

(71) Applicant: SAMSUNG ELECTRONICS CO., LTD., Suwon-si (KR)

(72) Inventors: Inhyung Song, Cheonan-si (KR); Jongyoun Kim, Seoul (KR); Shanghoon Seo, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 995 days.

(21) Appl. No.: 17/813,362

(22) Filed: Jul. 19, 2022

(65) Prior Publication Data

US 2023/0107492 A1     Apr. 6, 2023

(30) Foreign Application Priority Data

Oct. 5, 2021    (KR) ........................ 10-2021-0131968

(51) Int. Cl.
*H10W 46/00*      (2026.01)
*H10W 70/60*      (2026.01)
(Continued)

(52) U.S. Cl.
CPC .......... *H10W 46/00* (2026.01); *H10W 46/101* (2026.01); *H10W 46/103* (2026.01); *H10W 46/106* (2026.01); *H10W 46/407* (2026.01); *H10W 46/607* (2026.01); *H10W 70/60* (2026.01); *H10W 70/614* (2026.01);
(Continued)

(58) Field of Classification Search
CPC ............... H01L 23/544; H01L 23/3128; H01L 23/49822; H01L 23/5389; H01L 2224/16238; H01L 23/49811; H01L 23/49816; H01L 23/49833; H01L 23/49838; H01L 24/16; H01L 24/48; H01L 25/105; H01L 2223/54406;
(Continued)

(56) References Cited

U.S. PATENT DOCUMENTS 9,343,386 B2   5/2016   Huang et al.
9,343,434 B2   5/2016   Chen
(Continued)

FOREIGN PATENT DOCUMENTS

JP     2018-160527 A    10/2018
KR   10-2009-0098070     9/2009
(Continued)

OTHER PUBLICATIONS

Office Action dated Oct. 17, 2024 in related TW Patent Application No. 111137477, 6 pages (in Chinese).
(Continued)

*Primary Examiner* — Britt Hanley
*Assistant Examiner* — Victor V Barzykin
(74) *Attorney, Agent, or Firm* — Morgan, Lewis & Bockius LLP

(57) ABSTRACT

A semiconductor package includes: an encapsulation layer sealing at least one semiconductor chip; a redistribution level layer arranged on the encapsulation layer; a laser mark metal layer arranged on the redistribution level layer; and a laser mark arranged inside the laser mark metal layer. The laser mark includes letters, numbers, figures, symbols, and recognition codes indicating various pieces of information of the semiconductor package.

20 Claims, 22 Drawing Sheets

(51) Int. Cl.

| | |
|---|---|
| *H10W 70/65* | (2026.01) |
| *H10W 70/685* | (2026.01) |
| *H10W 74/00* | (2026.01) |
| *H10W 74/10* | (2026.01) |
| *H10W 90/00* | (2026.01) |

(52) U.S. Cl.
    CPC .......... *H10W 70/65* (2026.01); *H10W 70/685* (2026.01); *H10W 74/00* (2026.01); *H10W 74/117* (2026.01); *H10W 90/00* (2026.01); *H10W 90/401* (2026.01); *H10W 90/701* (2026.01); *H10W 90/722* (2026.01); *H10W 90/724* (2026.01); *H10W 90/754* (2026.01)

(58) Field of Classification Search
    CPC ... H01L 2223/54413; H01L 2223/5442; H01L 2223/54446
    See application file for complete search history.

(56)                References Cited

U.S. PATENT DOCUMENTS

| | | | |
|---|---|---|---|
| 9,508,696 | B2 | 11/2016 | Chen |
| 9,721,933 | B2 | 8/2017 | Chen |
| 10,096,553 | B2 * | 10/2018 | Su ......................... H01L 23/544 |
| 10,546,818 | B2 | 1/2020 | Takano |
| 10,825,778 | B2 | 11/2020 | Bae et al. |
| 2010/0301474 | A1 | 12/2010 | Yang |
| 2011/0291249 | A1 | 12/2011 | Chi et al. |
| 2014/0175657 | A1 | 6/2014 | Oka et al. |
| 2015/0380359 | A1 * | 12/2015 | Lim ...................... H01L 23/544 |
| | | | 257/773 |
| 2020/0135656 | A1 | 4/2020 | Zhou et al. |
| 2020/0273806 | A1 | 8/2020 | Chiang et al. |

FOREIGN PATENT DOCUMENTS

| | | |
|---|---|---|
| KR | 10-2015-0137964 A | 12/2015 |
| KR | 10-2016-0001169 A | 1/2016 |
| KR | 10-2020-0038090 A | 4/2020 |
| TW | 201543642 A | 11/2015 |

OTHER PUBLICATIONS

Office Action of Korean Patent Office in Application No. 10-2021-0131968, dated Aug. 1, 2025.

* cited by examiner

<u>PK1</u>

PK1

36

SAMSUNG XXX

ABCD

LOT 1234

SEMICONDUCTOR PACKAGE

CROSS-REFERENCE TO RELATED APPLICATION

This application claims priority under 35 U.S.C. § 119 to Korean Patent Application No. 10-2021-0131968, filed on Oct. 5, 2021, in the Korean Intellectual Property Office, the disclosure of which is incorporated by reference herein in its entirety.

TECHNICAL FIELD

The present inventive concept relates to a semiconductor package, and more particularly, to a semiconductor package including a laser mark.

DISCUSSION OF RELATED ART

A laser mark indicating product information may be marked on a surface of a semiconductor package including a semiconductor chip. As semiconductor packages are becoming thinner, it may be difficult to form a laser mark without damage to the semiconductor package. For example, during the formation of a laser mark with a laser on a semiconductor package, heat is generated, and may damage the semiconductor package. In addition, a laser mark needs to have good visibility to be easily recognized by a user. However, in many instances, the laser used in forming the laser mark may be reflected at the surface of the semiconductor package, or transmitted right through the semiconductor package, and thus, forming the laser mark may be difficult, and the visibility of the laser mark formed may be relatively low.

SUMMARY

The present inventive concept provides a semiconductor package including a laser mark that has visibility without package damage.

According to an embodiment of the present inventive concept, there is provided a semiconductor package including: an encapsulation layer sealing at least one semiconductor chip; a redistribution level layer arranged on the encapsulation layer; a laser mark metal layer arranged on the redistribution level layer; and a laser mark arranged inside the laser mark metal layer.

According to an embodiment of the present inventive concept, there is provided a semiconductor package including: a fan-in region in which a semiconductor chip is located, and a fan-out region surrounding the fan-in region and including a package element including an inner wiring layer; a package body level layer including an encapsulation layer sealing the semiconductor chip in the fan-in region and the inner wiring layer in the fan-out region; a first redistribution level layer arranged on a lower surface of the package body level layer and including a first redistribution layer and a first redistribution insulating layer, in which the first redistribution layer extends from the fan-in region to the fan-out region, and the first redistribution insulating layer insulates the first redistribution layer; a second redistribution level layer arranged on an upper surface of the package body level layer and including a second redistribution layer and a second redistribution insulating layer, in which the second redistribution layer extends from the fan-in region to the fan-out region and the second redistribution insulating layer insulates the second redistribution layer; a laser mark metal layer arranged on the second redistribution level layer; and a laser mark arranged inside the laser mark metal layer.

According to an embodiment of the present inventive concept, there is provided a semiconductor package including: a fan-in region in which a semiconductor chip is located, and a fan-out region surrounding the fan-in region and including an inner wiring layer; a package body level layer including an encapsulation layer sealing the semiconductor chip in the fan-in region and the inner wiring layer in the fan-out region; a first redistribution level layer arranged on a lower surface of the package body level layer and including a first redistribution layer and a first redistribution insulating layer, in which the first redistribution layer extends from the fan-in region to the fan-out region and the first redistribution insulating layer insulates the first redistribution layer; a second redistribution level layer arranged on an upper surface of the package body level layer and including a second redistribution layer and a second redistribution insulating layer, in which the second redistribution layer extends from the fan-in region to the fan-out region and the second redistribution insulating layer insulates the second redistribution layer; a laser mark metal layer arranged on the second redistribution level layer in the fan-in region and configured to have a plurality of sub-metal layers; and a laser mark arranged inside the laser mark metal layer.

BRIEF DESCRIPTION OF THE DRAWINGS

Embodiments of the present inventive concept will be more clearly understood from the following detailed description taken in conjunction with the accompanying drawings, in which.

Figure 1:
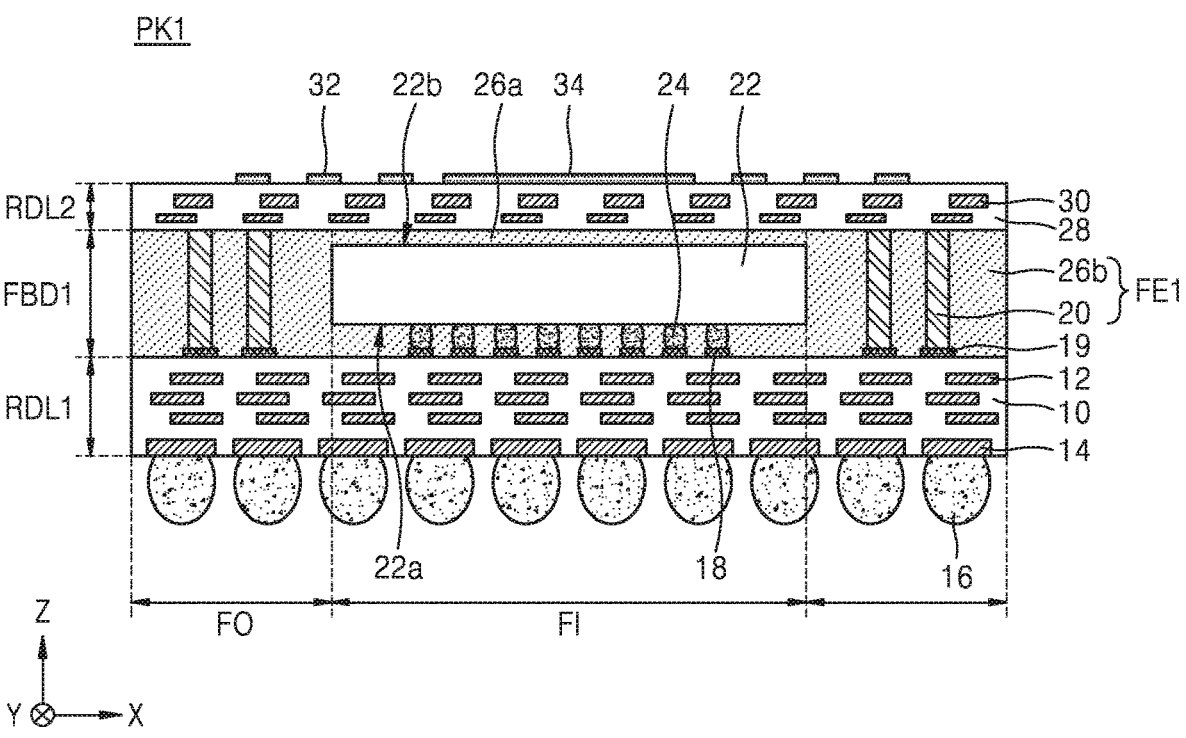
FIG. 1 is a cross-sectional view of a semiconductor package according to an embodiment of the present inventive concept.

Since the drawings in FIGS. 1-18 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, embodiments of the present inventive concept will be described in detail with reference to the accompanying drawings. Embodiments of the present inventive concept may be implemented as one of them, and also, the embodiments described below may be implemented by combining at least two of the embodiments. Therefore, the present inventive concept shall not be interpreted by limiting the same to a single embodiment.

As used herein, the singular forms "a", "an" and "the" are intended to include the plural forms as well, unless the context clearly indicates otherwise.

FIG. 1 is a cross-sectional view of a semiconductor package according to an embodiment of the present inventive concept.

In detail, FIG. 1 illustrating a semiconductor package PK1 may be a cross-sectional view in XZ direction (e.g., XZ plane), that is, in an X-direction and a Z-direction. The semiconductor package PK1 may be a fan-out semiconductor package. For example, the semiconductor package PK1 may be a fan-out wafer level-package (FOWLP) type, which is an enhancement of standard wafer-level packaging (WLP) solutions.

The semiconductor package PK1 may include a fan-in region FI in which a semiconductor chip 22 is located and a fan-out region FO on both sides of the fan-in region FI. The fan-out region FO may surround the fan-in region FI on a plane. While the semiconductor chip 22 is described as a single chip in FIG. 1, the present inventive concept is not limited thereto. For example, in an embodiment of the present inventive concept, the semiconductor chip 22 may include a plurality of stacked chips.

The semiconductor chip 22 may include, for example, a logic chip, a power management integrated circuit (PMIC) chip, or a memory chip. In an embodiment of the present inventive concept, the logic chip may include, for example, a memory controller chip, a central processing unit (CPU) chip, a graphic processing unit (GPU) chip, a field programmable gate array (FPGA) chip, a digital signal processor (DSP) chip, an application specific integrated circuit (ASIC) chip, or an application processor (AP) chip.

In an embodiment of the present inventive concept, the memory chip may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, ferroelectric random access memory (FeRAM) chip, or a resistive random access memory (RRAM) chip.

The semiconductor chip 22 may include a front surface 22a and a rear surface 22b positioned opposite to the front surface 22a. The front surface 22a may be an active surface, and the rear surface 22b may be a non-active surface. A chip solder ball 24 is arranged on the front surface 22a, and may include a chip connection ball or a chip connection bump. For example, chip solder ball 24 may include a solder material, such as one or more of, for example, tin (Sn), silver (Ag), zinc (Zn), lead (Pb), and any alloy thereof.

The fan-out region FO may include a package element FE1 including an inner wiring layer 20. The inner wiring layer 20 may include a metal post layer, for example, a copper (Cu) post layer. In an embodiment of the present inventive concept, the inner wiring layer 20 may have a pillar shape, and may include metal, such as one or more of, for example, copper (Cu), aluminum (Al), tungsten (W), titanium (Ti), tantalum (Ta), and any alloy thereof. The inner wiring layer 20 may be a metal via layer. The package element FE1 may further include a fan-out encapsulation layer 26b sealing the inner wiring layer 20. The fan-out encapsulation layer 26b may include an epoxy molding compound (EMC), but the material of the fan-out encapsulation layer 26b is not particularly limited. For example, any other suitable thermosetting resin or thermoplastic resin may be used as the fan-out encapsulation layer 26b.

The semiconductor chip 22 of the fan-in region FI may be sealed by a fan-in encapsulation layer 26a. In an embodiment of the present inventive concept, the fan-in encapsulation layer 26a may seal at least one semiconductor chip. For example, the fan-in encapsulation layer 26a may seal the single semiconductor chip 22 as illustrated in FIG. 1, or may seal a plurality of semiconductor chips. The fan-in encapsulation layer 26a may be in a single body with the fan-out encapsulation layer 26b constituting the package element FE1. The fan-in encapsulation layer 26a may include a material the same as that of the fan-out encapsulation layer 26b constituting the package element FE1.

The semiconductor chip 22 in the fan-in region FI, the fan-in encapsulation layer 26a scaling the semiconductor chip 22 in the fan-in region FI, and the package element FE1 including the inner wiring layer 20 and the fan-out encapsulation layer 26b in the fan-out region FO may constitute a package body level layer FBD1.

The semiconductor package PK1 may include a first redistribution level layer RDL1 and a second redistribution level layer RDL2. As the first redistribution level layer RDL1 is formed on the front surface 22a of the semiconductor chip 22, the first redistribution level layer RDL1 may be referred to as a front surface redistribution level layer. As the second redistribution level layer RDL2 is formed on the rear surface 22b of the semiconductor chip 22, the second redistribution level layer RDL2 may be referred to as a rear surface redistribution level layer. The second redistribution level layer RDL2 may not be directly in physical contact with the rear surface 22b of the semiconductor chip 22, but the present inventive concept is not limited thereto. For example, the second redistribution level layer RDL2 may be directly in physical contact with a top surface of the fan-out encapsulation layer 26b and the rear surface 22b of the semiconductor chip 22.

The first redistribution level layer RDL1 may be arranged on a lower surface of the package body level layer FBD1 and include a first redistribution layer 12 extending from the fan-in region FI to the fan-out region FO, and a first redistribution insulating layer 10 that insulates the first redistribution layer 12. The first redistribution layer 12 may be formed of a metal layer including, for example, copper (Cu), aluminum (Al), nickel (Ni), titanium (Ti), or an alloy thereof. The first redistribution layer 12 may be formed of a single layer or multiple layers of the metal material described above.

The first redistribution insulating layer 10 may include a dielectric layer. The first redistribution insulating layer 10 may include an organic polymer including, for example, polybenzoxazole (PBO), benzocyclobutene (BCB), polyimide (PI), or the like. Alternatively, the organic polymer included in the first redistribution insulating layer 10 may include a photo-imageable dielectric (PID) material such as, for example, photosensitive polyimide (PSPI). The first redistribution insulating layer 10 may include an inorganic material such as, for example, silicon oxide ($SiO_2$), silicon nitride ($Si_3N_4$), or silicon oxynitride (SiON).

The first redistribution level layer RDL1 may include, on a lower side thereof, a first redistribution pad 14 electrically connected to the first redistribution layer 12. The first redistribution pad 14 may include a metal layer, for example, a copper (Cu) layer, a nickel (Ni) layer or a gold (Au) layer.

In FIG. 1, for convenience, the first redistribution pad 14 is illustrated as being included in the first redistribution level layer RDL1, but the present inventive concept is not limited thereto. For example, the first redistribution pad 14 may also be formed on the first redistribution level layer RDL1. In other words, the first redistribution pad 14 may be formed on a bottom surface of the first redistribution level layer RDL1, and may not be located inside the first redistribution level layer RDL1. A first solder ball 16 may be arranged on the first redistribution pad 14. The first solder ball 16 may be an external connection terminal for connection to an external device. For example, the external device may be electrically connected to the first redistribution level layer RDL1 through the first solder ball 16, for example, electrically connected to the first redistribution layer 12 and the first redistribution pad 14 through the first solder ball 16.

The first redistribution level layer RDL1 may include, on an upper side thereof, a chip connection pad 18 and a post connection pad 19 that are electrically connected to the first redistribution layer 12. The chip connection pad 18 and the post connection pad 19 may include a metal layer, such as, for example, a copper (Cu) layer or an aluminum (Al) layer.

In an embodiment of the present inventive concept, the chip connection pad 18 and the post connection pad 19 may be formed on the first redistribution insulating layer 10 of the first redistribution level layer RDL1 and thus included in the package body level layer FBD1. In an embodiment of the present inventive concept, the chip connection pad 18 and the post connection pad 19 may be formed inside the first redistribution insulating layer 10 and thus included in the first redistribution level layer RDL1. The chip connection pad 18 may be electrically connected to the chip solder ball 24 of the semiconductor chip 22. For example, the chip connection pad 18 may be provided to electrically connect the semiconductor chip 22 to other components, for example, to an external power source. The post connection pad 19 may be electrically connected to the inner wiring layer 20, that is, a metal post layer.

The second redistribution level layer RDL2 may be arranged on an upper surface of the package body level layer FBD1 and include a second redistribution layer 30 extending from the fan-in region FI to the fan-out region FO, and a second redistribution insulating layer 28 that insulates the second redistribution layer 30. The second redistribution layer 30 may include a material the same as that of the first redistribution layer 12. The second redistribution insulating layer 28 may include a material the same as that of the first redistribution insulating layer 10.

The semiconductor package PK1 may include a second redistribution pad 32 and a laser mark metal layer 34. The second redistribution pad 32 and the laser mark metal layer 34 may be simultaneously formed at the same level. For example, the second redistribution pad 32 and the laser mark metal layer 34 may be formed of the same material. The second redistribution pad 32 may be on the second redistribution level layer RDL2. The second redistribution pad 32 and the laser mark metal layer 34 may include, for example, nickel (Ni), aluminum (Al), iron (Fe), copper (Cu), titanium (Ti), chromium (Cr), gold (Au), silver (Ag), palladium (Pd), platinum (Pt), or a combination thereof.

The second redistribution pad 32 may include a metal pad. The second redistribution pad 32 may include a joint pad electrically coupled to an external semiconductor package. In an embodiment of the present inventive concept, the second redistribution pad 32 may be arranged in the fan-in region FI and the fan-out region FO. In an embodiment of the present inventive concept, the second redistribution pad 32 may not be arranged in the fan-in region FI but may be arranged only in the fan-out region FO.

The second redistribution pad 32 may be electrically connected to the second redistribution layer 30. The second redistribution pad 32 may be arranged on the second redistribution level layer RDL2 and spaced apart from the laser mark metal layer 34. The second redistribution pad 32 may include a metal layer, for example, a copper (Cu) layer or an aluminum (Al) layer. Solder balls may be formed on the second redistribution pad 32, and an external semiconductor package may be mounted thereon. To be described with reference to FIG. 16, a second semiconductor package PK6 may be mounted on the second redistribution pad 32 through a second solder ball 72.

The laser mark metal layer 34 may be on the second redistribution level layer RDL2. For example, the laser mark metal layer 34 may be arranged on a partial region (i.e., a portion) of the entire surface (e.g., top surface) of the second redistribution level layer RDL2. The laser mark metal layer 34 may be arranged on the second redistribution level layer RDL2 of the fan-in region FI, apart from the second redistribution pad 32. For example, the laser mark metal layer 34 may be arranged on a portion of an entire surface (e.g., top surface) of the second redistribution level layer RDL2 of the fan-in region FI. The laser mark metal layer 34 may be over the semiconductor chip 22, for example, over a center portion of the semiconductor chip 22. For example, the laser mark metal layer 34 may overlap the center portion of the semiconductor chip 22 in the Z direction.

The laser mark metal layer 34 may be arranged in a region where the second redistribution pad 32 is not formed. The laser mark metal layer 34 may include a dummy metal layer that is not electrically connected to the second redistribution pad 32.

Inside the laser mark metal layer 34, a laser mark (36 of FIG. 3A) formed by laser as described below may be located. The laser mark (36 of FIG. 3A) may include letters, numbers, figures, symbols, and recognition codes indicating various pieces of information of the semiconductor package PK1 to be used to track the semiconductor package PK1.

As the laser mark (36 of FIG. 3A) is formed inside the laser mark metal layer 34 on the second redistribution level layer RDL2, damage to the second redistribution level layer RDL2 may be reduced. For example, during the formation of a laser mark with a laser incident on the second redistribution level layer RDL2, heat may be generated, and may damage the second redistribution level layer RDL2. Also, forming a laser mark on the second redistribution level layer RDL2 may be difficult, because a laser transmits therethrough or a reflectance of the laser is high, and visibility of the laser mark is relatively low. However, in the semiconductor package PK1 according to the present inventive concept, the laser mark (36 in FIG. 3A) may be easily formed inside the laser mark metal layer 34, and also, the visibility of the laser mark may be enhanced. Also, since the laser mark (36 in FIG. 3A) is formed inside the laser mark metal layer 34, the laser may be prevented from reaching the second redistribution insulating layer 28 to cause damage to the second redistribution level layer RDL2. The laser mark metal layer 34 and the laser mark formed inside the laser mark metal layer 34 are described in further detail below.

Figure 2:
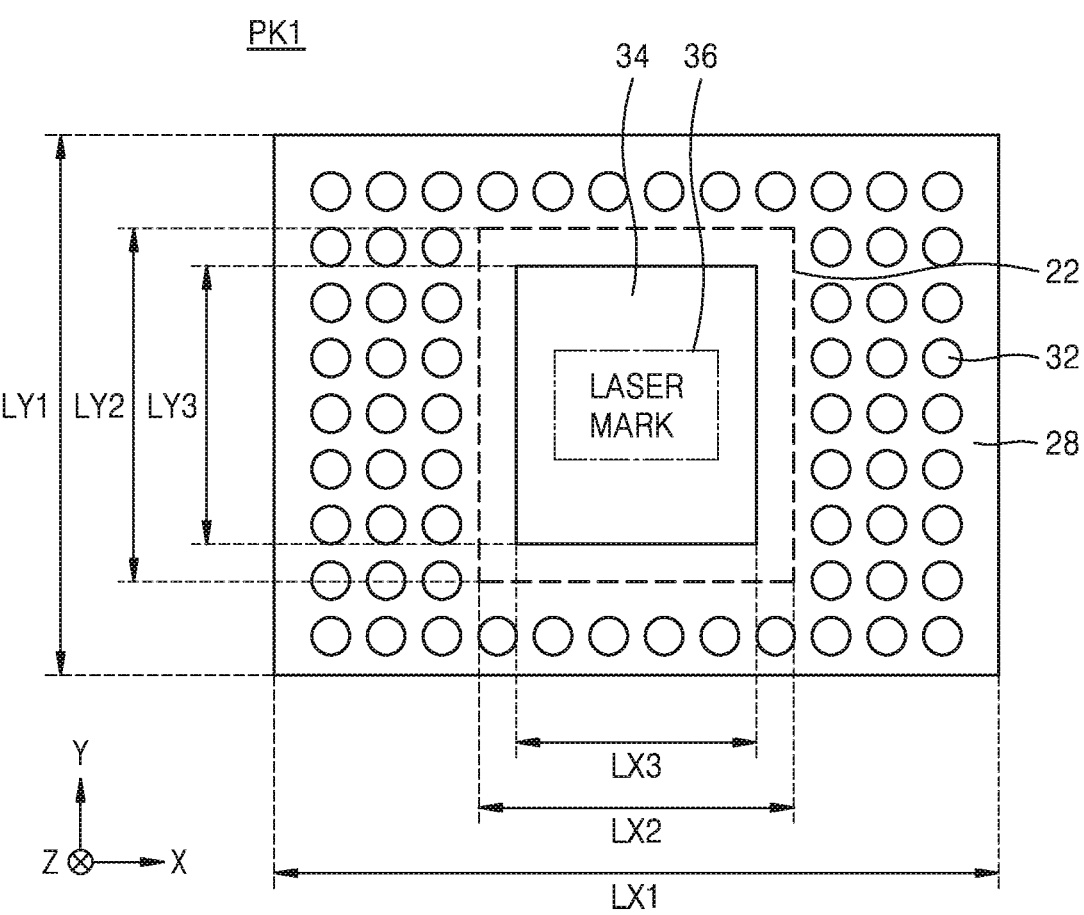
FIG. 2 is a top plan view of the semiconductor package of FIG. 1.

FIG. 2 is a top plan view of the semiconductor package of FIG. 1.

Like reference numerals in FIG. 2 as those of FIG. 1 may denote like elements. FIG. 2 illustrating the semiconductor package PK1 may be a plan view in XY direction (e.g., XY plane), that is, the X-direction and a Y-direction. The semiconductor package PK1 may have lengths LX1 and LY1 in the X- and Y-directions, respectively. In an embodiment of the present inventive concept, the lengths LX1 and LY1 may be between about 10 mm and about 60 mm. FIG. 2 illustrates that the length LX1 is greater than the length LY1, but the present inventive concept is not limited thereto. For example, the lengths LX1 and LY1 may be the same or the length LX1 may be smaller than the length LY1. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

The semiconductor package PK1 may include the semiconductor chip 22. The semiconductor chip 22 may have lengths LX2 and LY2 in the X- and Y-directions, respectively. In an embodiment of the present inventive concept, the lengths LX2 and LY2 may be between about 2 mm and about 55 mm. In an embodiment of the present inventive concept, a planar area (e.g., on the XY plane) of the semiconductor chip 22 may be about 4% to about 84% of a planar area of the semiconductor package PK1.

The semiconductor package PK1 may include the laser mark metal layer 34. The laser mark metal layer 34 may be in a central region of the semiconductor package PK1. The laser mark metal layer 34 may be in a central region on the semiconductor chip 22. The laser mark metal layer 34 may be on a central region of the second redistribution insulating layer 28 constituting the second redistribution level layer (RDL2 of FIG. 1).

The second redistribution pad 32 may be in a peripheral region of the second redistribution insulating layer 28 constituting the second redistribution level layer (RDL2 OF FIG. 1). In other words, the laser mark metal layer 34 may be over a region of the second redistribution insulating layer 28 constituting the second redistribution level layer (RDL2 OF FIG. 1), wherein the second redistribution pad 32 is not formed over the above region. For example, the second redistribution pad 32 may be arranged on the second redistribution level layer (RDL2 OF FIG. 1), and may be spaced apart from the laser mark metal layer 34 on a level the same as that of the laser mark metal layer 34.

The laser mark metal layer 34 may have lengths LX3 and LY3 in the X- and Y-directions, respectively. In an embodiment of the present inventive concept, the lengths LX3 and LY3 may be between about 1 mm and about 50 mm. In an embodiment of the present inventive concept, a planar area of the laser mark metal layer 34 may be about 1% to about 69% of the planar area of the semiconductor package PK1. For example, the laser mark metal layer 34 may be arranged in a portion, which is about 1% to about 69%, of an entire surface (e.g., top surface) of the second redistribution level layer (RDL2 OF FIG. 1).

A laser mark 36 may be located in the laser mark metal layer 34 inside the semiconductor package PK1. The laser mark 36 is described in further detail below.

Figure 3A:
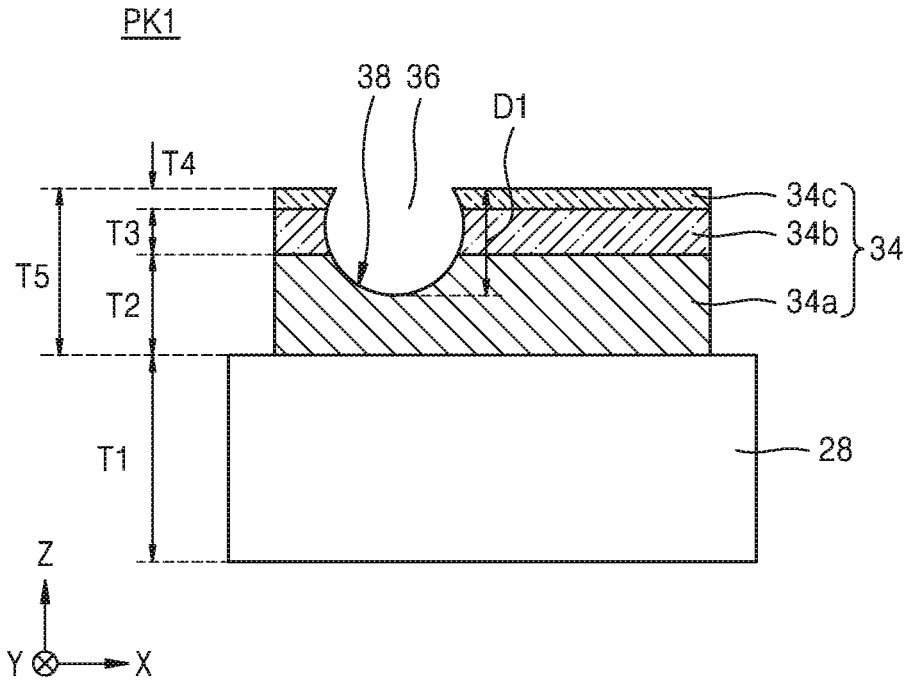
FIG. 3A is an enlarged cross-sectional view for describing a laser mark formed in a laser mark metal layer of the semiconductor package of FIGS. 1 and 2.
Figure 3B:
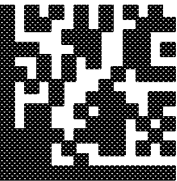
FIG. 3B is a plan view for describing the laser mark of FIG. 3A.
Figure 3B:
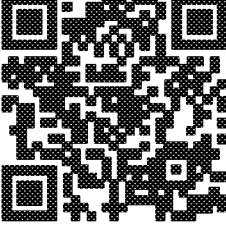
Figure 3B:
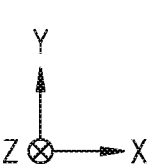

FIG. 3A is an enlarged cross-sectional view for describing the laser mark 36 formed in the laser mark metal layer 34 of the semiconductor package PK1 of FIGS. 1 and 2, and FIG. 3B is a plan view for describing the laser mark 36 of FIG. 3A. The laser mark 36 may be an air gap or an air space formed by laser. However, the present inventive concept is not limited thereto. For example, the laser mark 36 may be an air gap or an air space formed by laser then filled with a suitable material to have good visibility to be easily recognized by a user.

In the semiconductor package PK1, the laser mark metal layer 34 may be on the second redistribution insulating layer 28 constituting the second redistribution level layer (RDL2 OF FIG. 1). As described above, the laser mark metal layer 34 may be selected from, for example, nickel (Ni), aluminum (Al), iron (Fc), copper (Cu), titanium (Ti), chromium (Cr), gold (Au), silver (Ag), palladium (Pd), platinum (Pt) and alloy thereof. The second redistribution insulating layer 28 may have a first thickness T1. The first thickness T1 may be several micrometers (μm). The first thickness T1 may be about 1 μm to about 7 μm.

The laser mark metal layer 34 may include a plurality of sub-metal layers 34a. 34b, and 34c in a cross-section. The laser mark metal layer 34 may include a first sub-metal layer 34a, a second sub-metal layer 34b, and a third sub-metal layer 34c sequentially stacked on the second redistribution insulating layer 28. In an embodiment of the present inventive concept, the first sub-metal layer 34a, the second sub-metal layer 34b, and the third sub-metal layer 34c may be a copper (Cu) layer, a nickel (Ni) layer, and a gold (Au) layer, respectively. However, the present inventive concept is not limited thereto.

The first sub-metal layer 34a may have a second thickness T2. The second thickness T2 may be about 1 μm to about 5 μm. The second sub-metal layer 34b may have a third thickness T3. The third thickness T3 of the second sub-metal layer 34b may be smaller than the second thickness T2 of the first sub-metal layer 34a. The third thickness T3 may be about 1 μm to about 5 μm.

The third sub-metal layer 34c may have a fourth thickness T4. The fourth thickness T4 of the third sub-metal layer 34c may be smaller than the second thickness T2 of the first sub-metal layer 34a and the third thickness T3 of the second sub-metal layer 34b. The fourth thickness T4 may be about 0.1 μm to about 1 μm.

The laser mark metal layer 34 including the first sub-metal layer 34a, the second sub-metal layer 34b, and the third sub-metal layer 34c may have a fifth thickness T5. The fifth thickness T5 may be several micrometers (μm). The fifth thickness T5 may be about 3 μm to about 10 μm.

The laser mark 36 may be provided inside the laser mark metal layer 34. The laser mark 36 may include a circular laser pattern 38 in a cross-section (cross-sectional view), formed by ablation generated by applying laser to the laser mark metal layer 34. In other words, the laser mark 36 may be the circular laser pattern 38 in a cross-section, which is obtained as a portion of the laser mark metal layer 34 is melted and evaporated by laser applied to the laser mark metal layer 34. For example, at the portion of the laser mark metal layer 34 irradiated by the laser beam, the material of the laser mark metal layer 34 may be heated by the absorbed laser energy and may evaporate or sublimate to form an air space having the circular laser pattern 38 as the laser mark 36.

The circular laser pattern 38 in a cross-section, constituting the laser mark 36, may have a depth D1. The bottom of the circular laser pattern 38 in a cross-section may be located inside the first sub-metal layer 34*a*. For example, the bottom of the circular laser pattern 38 in a cross-section may be located between the top surface and the bottom surface of the first sub-metal layer 34*a*. The depth D1 of the circular laser pattern 38 may be several micrometers (μm). In other words, the laser mark 36 may have the depth D1 of several micrometers (μm) into the laser mark metal layer 34 in a cross-section. For example, the depth D1 of the circular laser pattern 38 in a cross-section may be about 0.1 μm to about 5 μm.

In FIG. 3A, only one circular laser pattern 38 formed inside the laser mark metal layer 34 in a cross section is illustrated, but the present inventive concept is not limited thereto. For example, a plurality of circular laser patterns may also be formed in the laser mark metal layer 34 in a cross section to form the laser mark 36. As the depth D1 of the circular laser pattern 38 constituting the laser mark 36 is several micrometers (μm), the laser mark 36 may be easily formed by using a laser mark forming apparatus (50 in FIG. 14) described later by using low energy, for example, several Watts. For example, the depth D1 of the circular laser pattern 38 constituting the laser mark 36 may be precisely controlled by adjusting the applied energy of the laser beam incident onto the laser mark metal layer 34 using the laser mark forming apparatus (50 in FIG. 14) to be described.

The laser mark 36 may include, as illustrated in FIG. 3B, letters, numbers, figures, symbols, and recognition codes indicating various pieces of information of the semiconductor package PK1. The letters may include a product logo or serial number, for example, for identifying the product. The recognition codes may include a two dimensional (2D) bar code and a quick response (QR) code.

Figure 4A:
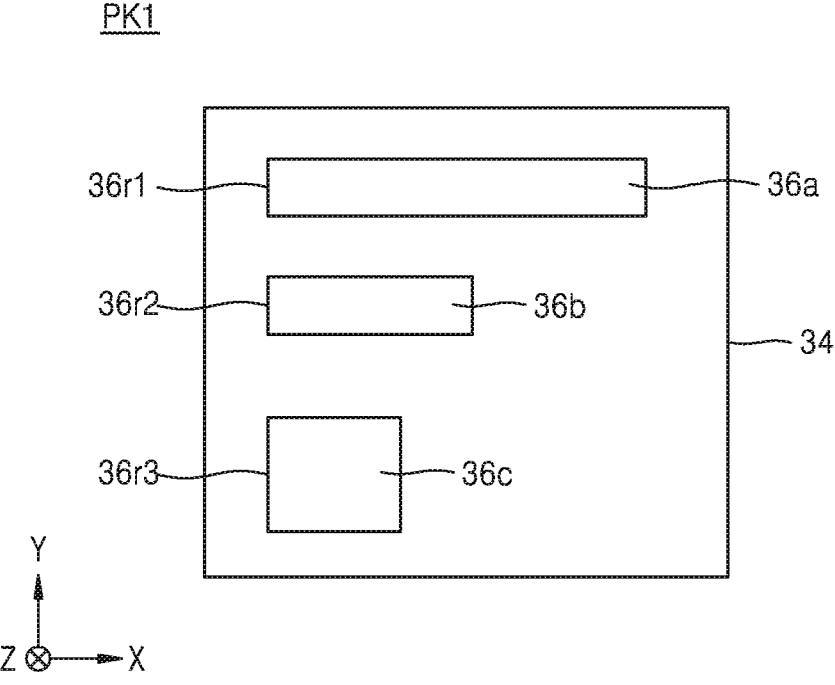
FIGS. 4A and 4B are plan views for describing various arrangement examples of the laser mark of FIGS. 3A and 3B.
Figure 4B:
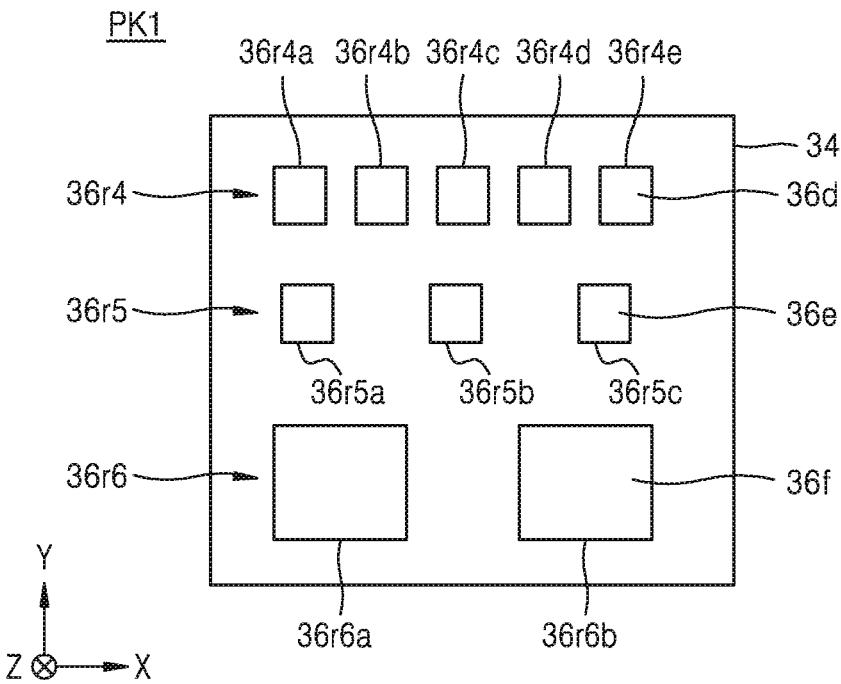

FIGS. 4A and 4B are plan views for describing various arrangement examples of the laser mark of FIGS. 3A and 3B.

As illustrated in FIG. 4A, a plurality of, for example, first to third laser marks 36*a*, 36*b*, and 36*c* may be formed in the laser mark metal layer 34 in the semiconductor package PK1. The first to third laser marks 36*a*, 36*b*, and 36*c* may be formed in first to third laser mark forming regions 36*r*1, 36*r*2, and 36*r*3, respectively.

The first to third laser mark forming regions 36*r*1, 36*r*2, and 36*r*3 may be referred to as laser pattern forming regions. The first to third laser mark forming regions 36*r*1, 36*r*2, and 36*r*3 are spaced apart from each other and may have various sizes in the X- and Y-directions.

In the first and second laser mark forming regions 36*r*1 and 36*r*2, letters or numbers may be formed, and in the third laser mark forming region 36*r*3, a recognition code, for example, a 2D bar code and a QR code may be formed. QR code may also be a 2D bar code, or may be a three dimensional (3D) bar code. Examples of the letters, numbers, 2D bar code and QR code included in the first to third laser marks 36*a*, 36*b*, and 36*c* formed in the first to third laser mark forming regions 36*r*1, 36*r*2, and 36*r*3, respectively, may be found in or referred to FIG. 3B as viewed in a plan view in the XY direction (e.g., XY plane).

As illustrated in FIG. 4B, in the semiconductor package PK1, a plurality of, for example, fourth to sixth laser marks 36*d*, 36*c*, and 36*f* may be formed in the laser mark metal layer 34. The fourth to sixth laser marks 36*d*, 36*c*, and 36*f* may be formed in the fourth to sixth laser mark forming regions 36*r*4, 36*r*5, and 36*r*6, respectively. The fourth to sixth laser mark forming regions 36*r*4, 36*r*5, and 36*r*6 may be referred to as laser pattern forming regions.

The fourth laser mark forming region 36*r*4 may include a plurality of, for example, first to fifth sub-laser mark forming regions 36*r*4*a*, 36*r*4*b*, 36*r*4*c*, 36*r*4*d*, and 36*r*4*c* that are spaced apart from each other. The fifth laser mark forming region 36*r*5 may include a plurality of, for example, sixth to eighth sub laser mark forming regions 36*r*5*a*, 36*r*5*b*, and 36*r*5*c* that are spaced apart from each other. Letters or numbers may be formed in the fourth and fifth laser mark forming regions 36*r*4 and 36*r*5. In some instances, symbols or figures may also be formed in the fourth and fifth laser mark forming regions 36*r*4 and 36*r*5.

The sixth laser mark forming region 36*r*6 may include a plurality of, for example, ninth and tenth sub laser mark forming regions 36*r*6*a* and 36*r*6*b* that are spaced apart from each other. In the sixth laser mark forming region 36*r*6, a recognition code, for example, a bar code and a QR code may be formed. Examples of the letters, numbers, bar code and QR code included in the fourth to sixth laser marks 36*d*. 36*c*, and 36*f* formed in the fourth to sixth laser mark forming regions 36*r*4, 36*r*5, and 36*r*6, respectively, may be found in or referred to FIG. 3B as viewed in a plan view in the XY direction (e.g., XY plane). As described above, in the semiconductor package PK1, the plurality of laser marks 36*a* to 36*f* of various shapes may be formed in the laser mark metal layer 34. Also, various laser marks having various shapes besides the laser marks 36*a* to 36F shown in FIGS. 4A and 4B may also be formed in laser pattern forming regions in the laser mark metal layer 34 for the semiconductor package PK1.

Figure 5A:
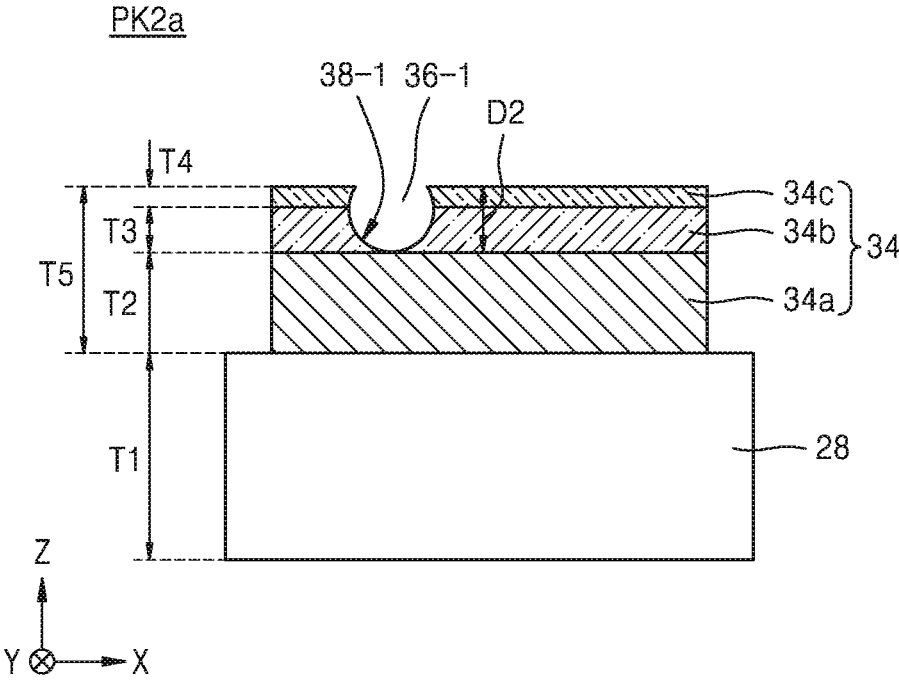
FIGS. 5A and 5B are enlarged cross-sectional views for describing a laser mark formed in a laser mark metal layer of a semiconductor package, according to an embodiment of the present inventive concept.
Figure 5B:
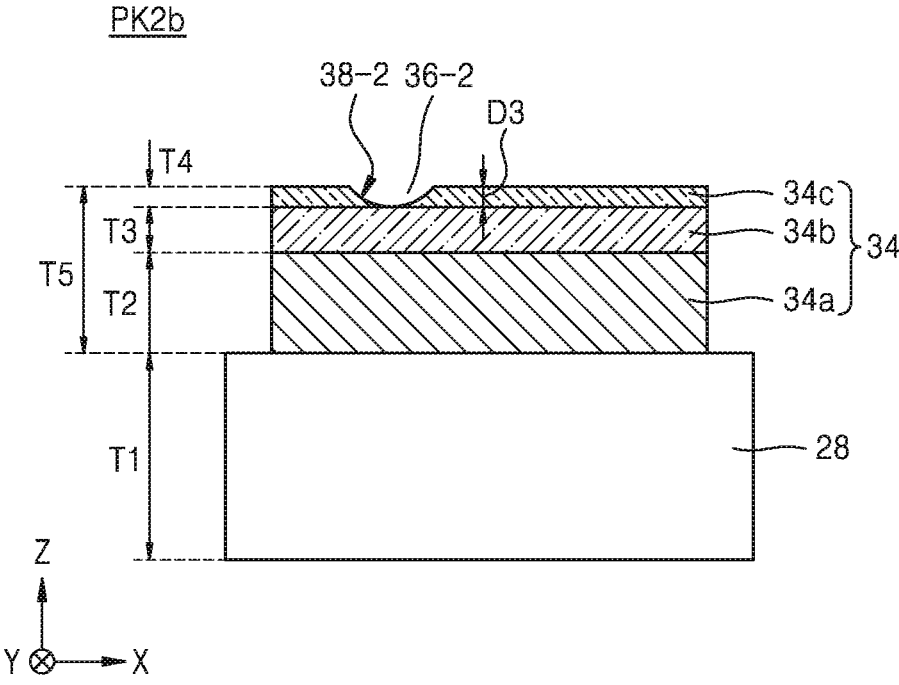

FIGS. 5A and 5B are enlarged cross-sectional views for describing a laser mark formed in a laser mark metal layer of a semiconductor package, according to an embodiment of the present inventive concept.

Semiconductor packages PK2*a* and PK2*b* of FIGS. 5A and 5B, respectively, may be identical to the semiconductor package PK1 of FIGS. 1, 2, 3A, 3B, 4A and 4B except for laser marks 36-1 and 36-2.

The semiconductor packages PK2*a* and PK2*b* of FIGS. 5A and 5B may be identical to the semiconductor package PK1 of FIG. 3A except for a difference in depths D2 and D3 of circular laser patterns 38-1 and 38-2 constituting the laser marks 36-1 and 36-2, respectively, in a cross-section.

In FIGS. 5A and 5B, the same reference numerals as those of FIGS. 1, 2, 3A, 3B, 4A and 4B denote the same elements. In FIGS. 5A and 5B, for convenience, the circular laser patterns 38-1 and 38-2 in a cross-section, constituting the laser marks 36-1 and 36-2 are described, but the present inventive concept is not limited thereto. For example, they may be formed also as an elliptical laser pattern.

In the semiconductor packages PK2*a* and PK2*b*, the laser mark metal layer 34 may be on the second redistribution insulating layer 28 constituting the second redistribution level layer (RDL2 OF FIG. 1). The laser mark metal layer 34 may include the plurality of sub-metal layers 34*a*, 34*b*, and 34*c*. The laser mark metal layer 34 may include the first sub-metal layer 34*a*, the second sub-metal layer 34*b*, and the third sub-metal layer 34c sequentially stacked on the second redistribution insulating layer 28.

In the semiconductor package PK2a of FIG. 5A, the laser mark 36-1 may be provided inside the laser mark metal layer 34. The laser mark 36-1 may be the circular laser pattern 38-1 in a cross-section, formed by ablation generated by applying laser to the laser mark metal layer 34. For example, at a portion of the laser mark metal layer 34 irradiated by the laser beam, the material of the laser mark metal layer 34 may be heated by the absorbed laser energy and may evaporate or sublimate to form an air space having the circular laser pattern 38-1 in a cross-section as the laser mark 36-1.

The circular laser pattern 38-1 in a cross-section, constituting the laser mark 36-1 may have the depth D2. The bottom of the circular laser pattern 38-1 in a cross-section may be located on a surface (e.g., top surface) of the first sub-metal layer 34a. Since the laser mark 36-1 penetrates the third sub-metal layer 34c and the second sub-metal layer 34b and stops at the top surface of the first sub-metal layer 34a, the laser may be prevented from reaching the second redistribution insulating layer 28 to cause damage to the second redistribution level layer RDL2. The depth D2 of the circular laser pattern 38-1 in a cross-section may be several micrometers (μm). For example, the depth D2 of the circular laser pattern 38-1 in a cross-section may be about 0.1 μm to about 5 μm. For example, the depth D2 of the circular laser pattern 38-1 constituting the laser mark 36-1 may be precisely controlled by adjusting the applied energy of the laser beam incident onto the laser mark metal layer 34 using the laser mark forming apparatus (50 in FIG. 14) to be described.

In the semiconductor package PK2b of FIG. 5B, the laser mark 36-2 may be provided inside the laser mark metal layer 34. The laser mark 36-2 may be the circular laser pattern 38-2 in a cross-section, formed by ablation generated by applying laser to the laser mark metal layer 34. For example, at a portion of the laser mark metal layer 34 irradiated by the laser beam, the material of the laser mark metal layer 34 may be heated by the absorbed laser energy and may evaporate or sublimate to form an air space having the circular laser pattern 38-2 in a cross-section as the laser mark 36-2.

The circular laser pattern 38-2 in a cross-section, constituting the laser mark 36-2 may have the depth D3. The bottom of the circular laser pattern 38-2 may be located on a surface (e.g., top surface) of the second sub-metal layer 34b. Since the laser mark 36-2 penetrates the third sub-metal layer 34c and stops at the top surface of the second sub-metal layer 34b, the laser may be prevented from reaching the second redistribution insulating layer 28 to cause damage to the second redistribution level layer RDL2. The depth D3 of the circular laser pattern 38-2 in a cross-section may be smaller than 1 micrometer (μm). For example, the depth D3 of the circular laser pattern 38-2 in a cross-section may be about 0.1 μm to about 3 μm. For example, the depth D3 of the circular laser pattern 38-2 constituting the laser mark 36-2 may be precisely controlled by adjusting the applied energy of the laser beam incident onto the laser mark metal layer 34 using the laser mark forming apparatus (50 in FIG. 14) to be described.

Figure 6A:
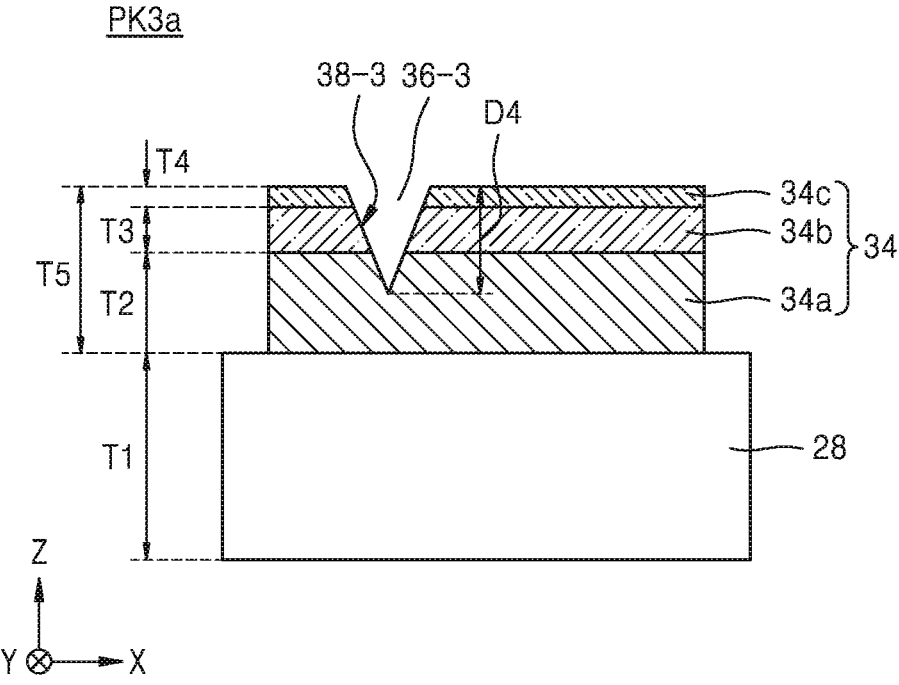
FIGS. 6A and 6B are enlarged cross-sectional views for describing a laser mark formed in a laser mark metal layer of a semiconductor package, according to an embodiment of the present inventive concept.
Figure 6B:
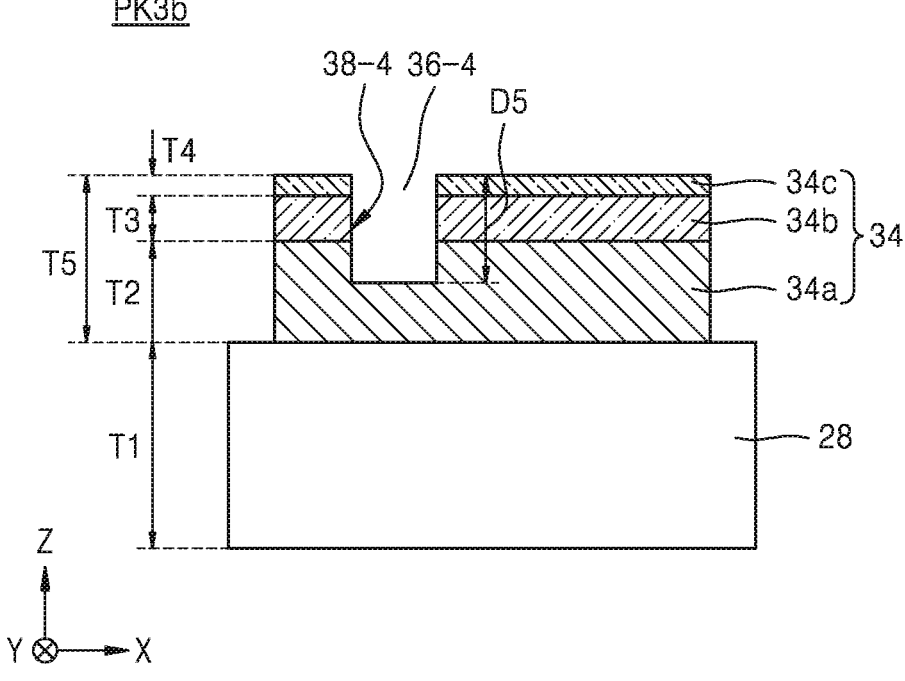

FIGS. 6A and 6B are enlarged cross-sectional views for describing a laser mark formed in a laser mark metal layer of a semiconductor package, according to an embodiment of the present inventive concept.

Semiconductor packages PK3a and PK3b of FIGS. 6A and 6B, respectively, may be identical to the semiconductor package PK1 of FIGS. 1, 2, 3A, 3B, 4A and 4B except for laser marks 36-3 and 36-4.

The semiconductor packages PK3a and PK3b of FIGS. 6A and 6B, respectively, may be identical to the semiconductor package PK1 of FIG. 3A except that triangular and quadrangular laser patterns 38-3 and 38-4 respectively constituting the laser marks 36-3 and 36-4 in a cross-section are included.

In FIGS. 6A and 6B, the same reference numerals as those of FIGS. 1, 2, 3A, 3B, 4A and 4B denote the same elements. In FIGS. 6A and 6B, for convenience, the triangular and quadrangular laser patterns 38-3 and 38-4 which are in a cross-section and respectively constitute the laser marks 36-3 and 36-4 are described, but the present inventive concept is not limited thereto. For example, they may also be formed as a polygonal laser pattern other than triangular and quadrangular laser patterns in a cross-section.

In the semiconductor packages PK3a and PK3b, the laser mark metal layer 34 may be on the second redistribution insulating layer 28 constituting the second redistribution level layer (RDL2 OF FIG. 1). The laser mark metal layer 34 may include the plurality of sub-metal layers 34a, 34b, and 34c. The laser mark metal layer 34 may include the first sub-metal layer 34a, the second sub-metal layer 34b, and the third sub-metal layer 34c sequentially stacked on the second redistribution insulating layer 28.

In the semiconductor package PK3a of FIG. 6A, the laser mark 36-3 may be provided inside the laser mark metal layer 34. The laser mark 36-3 may be the triangular laser pattern 38-3 in a cross-section, formed by ablation generated by applying laser to the laser mark metal layer 34. For example, at a portion of the laser mark metal layer 34 irradiated by the laser beam, the material of the laser mark metal layer 34 may be heated by the absorbed laser energy and may evaporate or sublimate to form an air space having the triangular laser pattern 38-3 as the laser mark 36-3.

The triangular laser pattern 38-3 constituting the laser mark 36-3 may have a depth D4. The bottom of the triangular laser pattern 38-3 may be located inside the first sub-metal layer 34a. For example, the bottom of the triangular laser pattern 38-3 in a cross-section may be located between the top surface and the bottom surface of the first sub-metal layer 34a. The depth D4 of the triangular laser pattern 38-3 may be several micrometers (μm). For example, the depth D4 of the triangular laser pattern 38-3 may be about 2 μm to about 5 μm. For example, the depth D4 of the circular laser pattern 38-3 constituting the laser mark 36-3 may be precisely controlled by adjusting the applied energy of the laser beam incident onto the laser mark metal layer 34 using the laser mark forming apparatus (50 in FIG. 14) to be described.

In the semiconductor package PK3b of FIG. 6B, the laser mark 36-4 may be provided inside the laser mark metal layer 34. The laser mark 36-4 may be the quadrangular laser pattern 38-4 in a cross-section, formed by ablation generated by applying laser to the laser mark metal layer 34. For example, at a portion of the laser mark metal layer 34 irradiated by the laser beam, the material of the laser mark metal layer 34 may be heated by the absorbed laser energy and may evaporate or sublimate to form an air space having the quadrangular laser pattern 38-4 as the laser mark 36-4.

The quadrangular laser pattern 38-4 in a cross-section, constituting the laser mark 36-4 may have a depth D5. The bottom of the quadrangular laser pattern 38-4 in a cross-section may be located inside the first sub-metal layer 34a. For example, the bottom of the quadrangular laser pattern 38-4 in a cross-section may be located between the top surface and the bottom surface of the first sub-metal layer 34a. The depth D5 of the quadrangular laser pattern 38-4 in a cross-section may be several micrometers (μm). For example, the depth D5 of the quadrangular laser pattern 38-4 in a cross-section may be about 2 μm to about 5 μm. For example, the depth D5 of the quadrangular laser pattern 38-4 constituting the laser mark 36-4 may be precisely controlled by adjusting the applied energy of the laser beam incident onto the laser mark metal layer 34 using the laser mark forming apparatus (50 in FIG. 14) to be described.

Figure 7:
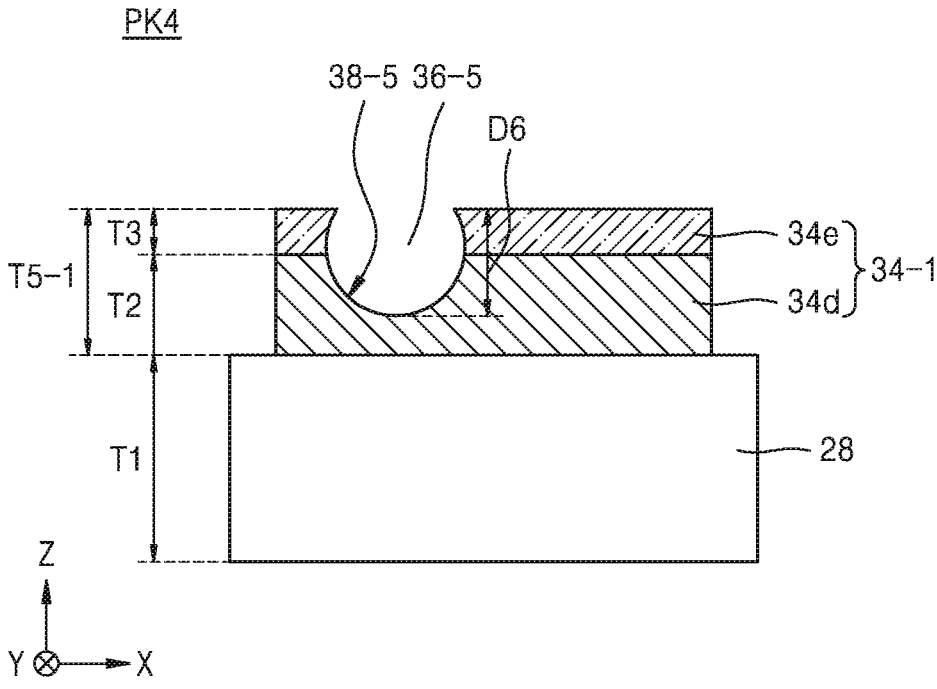
FIG. 7 is an enlarged cross-sectional view for describing a laser mark formed in a laser mark metal layer of a semiconductor package, according to an embodiment of the present inventive concept.

FIG. 7 is an enlarged cross-sectional view for describing a laser mark formed in a laser mark metal layer of a semiconductor package, according to an embodiment of the present inventive concept.

The semiconductor package PK4 of FIG. 7 may be identical to the semiconductor package PK1 of FIGS. 1, 2, 3A, 3B, 4A, and 4B except for a laser mark metal layer 34-1 and a laser mark 36-5. For example, the semiconductor package PK4 of FIG. 7 may be identical to the semiconductor package PK1 of FIG. 3A except that the laser mark metal layer 34-1 and the laser mark 36-5 are included.

In FIG. 7, the same reference numerals as those of FIGS. 1, 2, 3A, 3B, 4A, and 4B denote the same elements. While, for convenience, the laser mark 36-5 formed as the circular laser pattern 38-5 in a cross-section is described with reference to FIG. 7, but the present inventive concept is not limited thereto. For example, the laser mark 36-5 may also be formed as an elliptical laser pattern in a cross-section.

In the semiconductor package PK4, the laser mark metal layer 34-1 may be on the second redistribution insulating layer 28 constituting the second redistribution level layer (RDL2 OF FIG. 1). In an embodiment of the present inventive concept, the laser mark metal layer 34-1 may be selected from, for example, nickel (Ni), aluminum (Al), iron (Fe), copper (Cu), titanium (Ti), chromium (Cr), gold (Au), silver (Ag), palladium (Pd), platinum (Pt) and an alloy thereof.

The laser mark metal layer 34-1 may include a plurality of sub-metal layers 34*d* and 34*e*. The laser mark metal layer 34-1 may include a first sub-metal layer 34*d* and a second sub-metal layer 34*e* sequentially stacked on the second redistribution insulating layer 28. The first sub-metal layer 34*d* and the second sub-metal layer 34*e* may be a nickel (Ni) layer and a gold (Au) layer, respectively. However, the present inventive concept is not limited thereto.

The first sub-metal layer 34*d* may have a second thickness T2-1. The second thickness T2-1 may be about 1 μm to about 5 μm. The second sub-metal layer 34*e* may have a third thickness T3-1. The third thickness T3-1 of the second sub-metal layer 34*e* may be smaller than the second thickness T2-1 of the first sub-metal layer 34*d*. The third thickness T3-1 may be about 0.1 μm to about 3 μm.

The laser mark metal layer 34-1 including the first sub-metal layer 34*d* and the second sub-metal layer 34*c* may have a fifth thickness T5-1. The fifth thickness T5-1 may several micrometers (μm). The fifth thickness T5-1 may be about 1 μm to about 7 μm.

The laser mark 36-5 may be provided inside the laser mark metal layer 34-1. The laser mark 36-5 may be a circular laser pattern 38-5 in a cross-section, formed by ablation generated by applying laser to the laser mark metal layer 34-1. For example, at a portion of the laser mark metal layer 34 irradiated by the laser beam, the material of the laser mark metal layer 34-1 may be heated by the absorbed laser energy and may evaporate or sublimate to form an air space having the circular laser pattern 38-5 as the laser mark 36-5.

The circular laser pattern 38-5 in a cross-section, constituting the laser mark 36-5 may have a depth D6. The bottom of the circular laser pattern 38-5 in a cross-section may be located inside the first sub-metal layer 34*d*. For example, the bottom of the quadrangular laser pattern 38-5 in a cross-section may be located between the top surface and the bottom surface of the first sub-metal layer 34*d*. The depth D6 of the circular laser pattern 38-5 may be several micrometers (μm). For example, the depth D6 of the circular laser pattern 38-5 in a cross-section may be about 0.1 μm to about 3 μm. For example, the depth D6 of the circular laser pattern 38-5 constituting the laser mark 36-5 may be precisely controlled by adjusting the applied energy of the laser beam incident onto the laser mark metal layer 34-1 using the laser mark forming apparatus (50 in FIG. 14) to be described.

Figure 8:
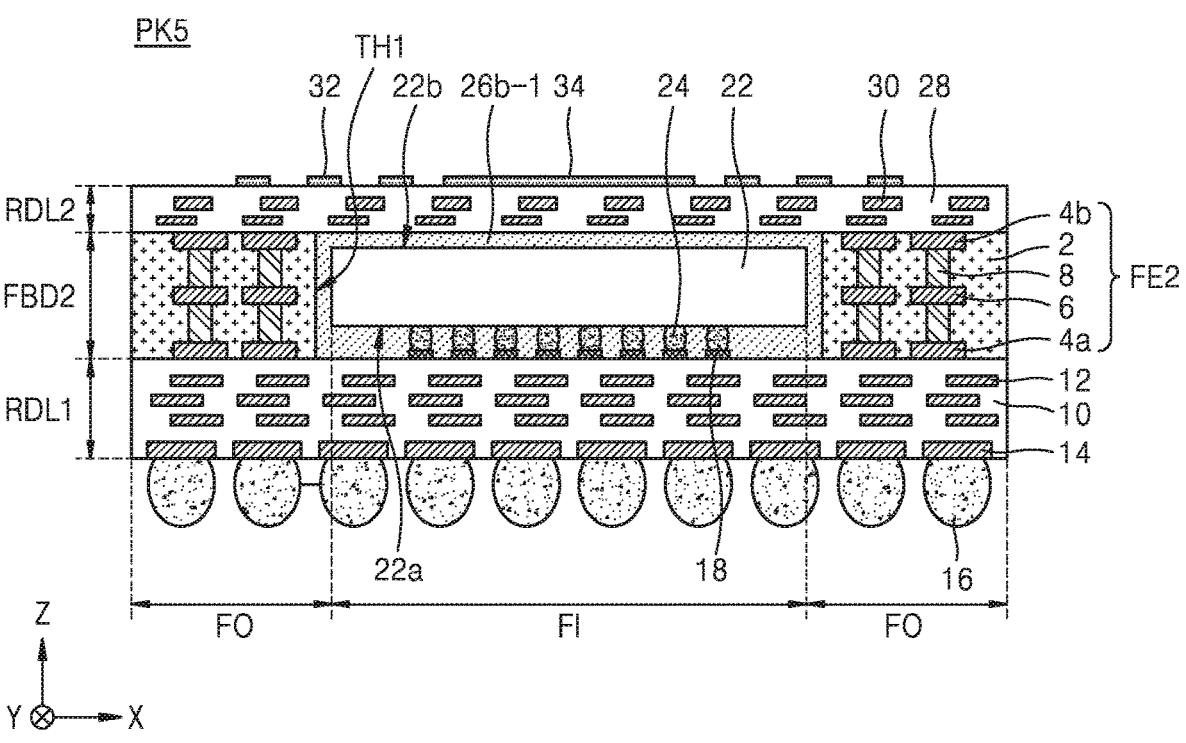
FIG. 8 is a cross-sectional view of a semiconductor package according to an embodiment of the present inventive concept.

FIG. 8 is a cross-sectional view of a semiconductor package according to an embodiment of the present inventive concept.

A semiconductor package PK5 of FIG. 8 may be identical to the semiconductor package PK1 of FIGS. 1, 2, 3A, 3B, 4A, and 4B except for a difference in a package element FE2.

The semiconductor package PK5 of FIG. 8 may be almost identical to the semiconductor package PK1 of FIG. 1 except that the package element FE2 includes a wiring substrate 2 and inner wiring layers 4*a*, 4*b*, 6, and 8. In FIG. 8, the same reference numerals as those of FIGS. 1, 2, 3A, 3B, 4A, and 4B denote the same elements.

The semiconductor package PK5 may be a fan-out semiconductor package. The semiconductor package PK5 may be a fan-out panel level package (FOPLP) type. The semiconductor package PK5 may include the fan-in region FI in which the semiconductor chip 22 is located and a fan-out region FO on both sides of the fan-in region FI.

The fan-out region FO may surround the fan-in region FI on a plane. While the semiconductor chip 22 is described as a single chip in FIG. 8, but the present inventive concept is not limited thereto. For example, the semiconductor chip 22 may include a plurality of stacked chips. The semiconductor chip 22 may include the front surface 22*a* and the rear surface 22*b* positioned opposite to the front surface 22*a*. The front surface 22*a* may be an active surface, and the rear surface 22*b* may be a non-active surface. The chip solder ball 24 is arranged on the front surface 22*a*, and may include a chip connection ball or a chip connection bump. For example, the chip solder ball 24 may include a solder material, such as one or more of, for example, tin (Sn), silver (Ag), zinc (Zn), lead (Pb), and any alloy thereof.

The fan-out region FO may include the package element FE2 including the wiring substrate 2 and the inner wiring layers 4*a*, 4*b*, 6, and 8. The wiring substrate 2 may be an insulating substrate. For example, the wiring substrate 2 may be a printed circuit board. The wiring substrate 2 may be referred to as a frame substrate. A through hole TH1 may be in the wiring substrate 2. The semiconductor chip 22 may be in the through hole TH1.

The inner wiring layers 4*a*, 4*b*, 6, and 8 may include an inner metal layer 6, a metal via layer 8, a lower metal pad layer 4*a*, and an upper metal pad layer 4*b*, which are formed in the wiring substrate 2. The semiconductor chip 22 of the fan-in region FI may be sealed by a fan-in encapsulation layer 26*b*-1. The fan-in encapsulation layer 26*b*-1 may include an EMC, but the material of the fan-in encapsulation layer 26*b*-1 is not particularly limited. For example, any other suitable thermosetting resin or thermoplastic resin may be used as the fan-in encapsulation layer 26*b*-1.

The semiconductor chip 22 in the fan-in region FI, the fan-in encapsulation layer 26*b*-1 scaling the semiconductor chip 22 in the fan-in region FI, and the package element FE2 including the wiring substrate 2, and the inner wiring layers 4a, 4b, 6, and 8 in the fan-out region FO may constitute a package body level layer FBD2.

The semiconductor package PK5 may include a first redistribution level layer RDL1 and a second redistribution level layer RDL2. As the first redistribution level layer RDL1 is formed on the front surface 22a of the semiconductor chip 22, first redistribution level layer RDL1 may be referred to as a front surface redistribution level layer. As the second redistribution level layer RDL2 is formed on the rear surface 22b of the semiconductor chip 22, the second redistribution level layer RDL2 may be referred to as a rear surface redistribution level layer. The second redistribution level layer RDL2 may not be directly in physical contact with the rear surface 22b of the semiconductor chip 22, but the present inventive concept is not limited thereto. For example, the second redistribution level layer RDL2 may be directly in physical contact with a top surface of the wiring substrate 2 and the rear surface 22b of the semiconductor chip 22.

The first redistribution level layer RDL1 and the second redistribution level layer RDL2 are described above, and thus are described briefly here. The first redistribution level layer RDL1 may be arranged on a lower surface of the package body level layer FBD2 and include the first redistribution layer 12 extending from the fan-in region FI to the fan-out region FO, and the first redistribution insulating layer 10 that insulates the first redistribution layer 12.

The first redistribution level layer RDL1 may include, on a lower side thereof, the first redistribution pad 14 electrically connected to the first redistribution layer 12. The first solder ball 16 may be arranged on the first redistribution pad 14. The first redistribution level layer RDL1 may include, on an upper side thereof, the chip connection pad 18 electrically connected to the first redistribution layer 12. The chip connection pad 18 may be electrically connected to the chip solder ball 24 of the semiconductor chip 22.

The second redistribution level layer RDL2 may be arranged on an upper surface of the package body level layer FBD2 and include a second redistribution layer 30 extending from the fan-in region FI to the fan-out region FO, and a second redistribution insulating layer 28 that insulates the second redistribution layer 30.

The semiconductor package PK5 may include the second redistribution pad 32 and the laser mark metal layer 34. The second redistribution pad 32 and the laser mark metal layer 34 are described above, and thus are briefly described here. The laser mark metal layer 34 may be on the second redistribution level layer RDL2.

Inside the laser mark metal layer 34, a laser mark formed by laser may be located as described above. As the laser mark is formed inside the laser mark metal layer 34 on the second redistribution level layer RDL2, damage to the second redistribution level layer RDL2 may be reduced. For example, during the formation of a laser mark with a laser incident on the second redistribution level layer RDL2, heat may be generated, and may damage the second redistribution level layer RDL2. Also, forming a laser mark on the second redistribution level layer RDL2 may be difficult, because a laser transmits therethrough or a reflectance of the laser is high, and visibility of the laser mark is relatively low. However, in the semiconductor package PK5 according to the present inventive concept, a laser mark may be easily formed inside the laser mark metal layer 34, and also, the visibility of the laser mark may be enhanced. Also, since the laser mark (36 in FIG. 3A) is formed inside the laser mark metal layer 34, the laser may be prevented from reaching the second redistribution insulating layer 28 to cause damage to the second redistribution level layer RDL2.

FIGS. 9 through 15 are cross-sectional views for describing a method of manufacturing a semiconductor package, according to an embodiment of the present inventive concept.

In detail, FIGS. 9 to 15 are diagrams for describing the method of manufacturing the semiconductor package PK1 of FIGS. 1, 2, 3A, 3B, 4A, and 4B. In particular, FIGS. 9 to 15 are diagrams for describing the semiconductor package PK1 of FIG. 1. In FIGS. 9 to 15, the same reference numerals as those of FIGS. 1, 2, 3A, 3B, 4A and 4B denote the same elements.

Figure 9:
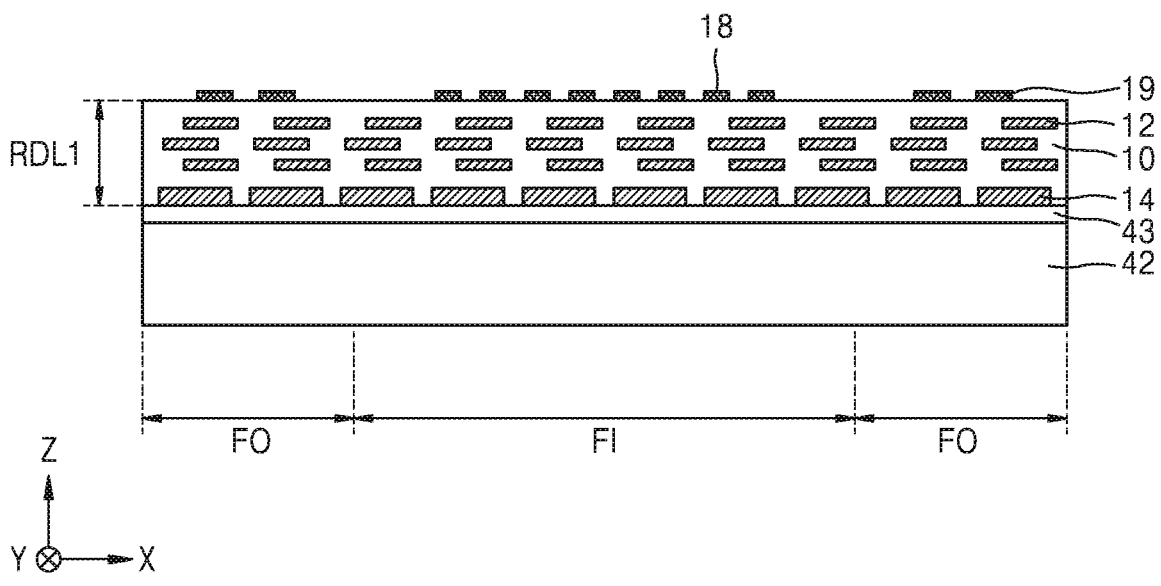
FIGS. 9 to 15 are cross-sectional views for describing a method of manufacturing a semiconductor package, according to an embodiment of the present inventive concept.

Referring to FIG. 9, the first redistribution level layer RDL1 is formed on a first carrier substrate 42 with an adhesive layer 43 interposed therebetween. The first carrier substrate 42 may include an insulating substrate or a semiconductor substrate. In an embodiment of the present inventive concept, the first carrier substrate 42 may include a glass substrate (or a glass wafer). In an embodiment of the present inventive concept, the first carrier substrate 42 may include a silicon (Si) substrate (or a silicon (Si) wafer).

The first redistribution level layer RDL1 may include the first redistribution layer 12 extending from the fan-in region FI to the fan-out region FO and the first redistribution insulating layer 10 insulating the first redistribution layer 12. The first redistribution level layer RDL1 may include, on the lower side thereof, the first redistribution pad 14 electrically connected to the first redistribution layer 12. The chip connection pad 18 electrically connected to the first redistribution layer 12 may be formed on the upper side of the first redistribution level layer RDL1 in the fan-in region FI.

The post connection pad 19 is formed on the first redistribution level layer RDL1 in the fan-out region FO. The chip connection pad 18 and the post connection pad 19 may be formed in a same process.

Figure 10:
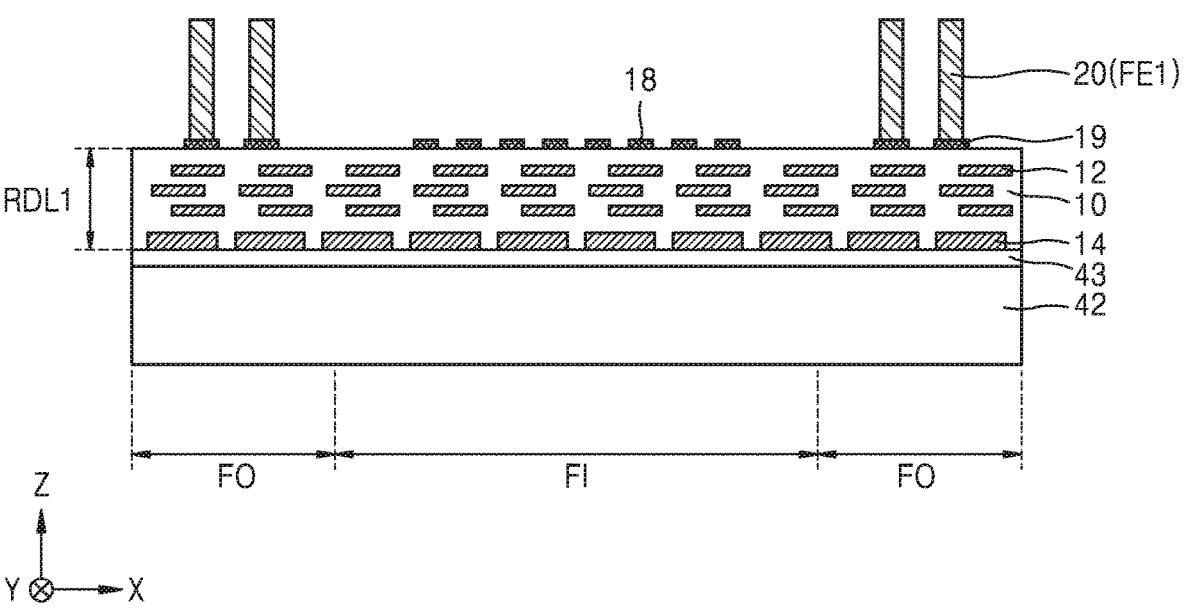

Referring to FIG. 10, the inner wiring layer 20 is formed on the post connection pad 19. In an embodiment of the present inventive concept, the inner wiring layer 20 of the fan-out region FO is formed by forming a metal material layer on the post connection pad 19 over the first redistribution level layer RDL1 and then selectively patterning the metal material layer by a photolithography process. In an embodiment of the present inventive concept, the post connection pad 19 and the inner wiring layer 20 may be formed at once on the first redistribution level layer RDL1 by using a damascene process.

The inner wiring layer 20 may include a metal post layer, for example, a copper (Cu) post layer. In an embodiment of the present inventive concept, the inner wiring layer 20 may have a pillar shape, and may include metal, such as one or more of, for example, copper (Cu), aluminum (Al), tungsten (W), titanium (Ti), tantalum (Ta), and any alloy thereof. The inner wiring layer 20 may include a metal via layer. The inner wiring layer 20 may be the package element FE1 of the fan-out region FO.

Figure 11:
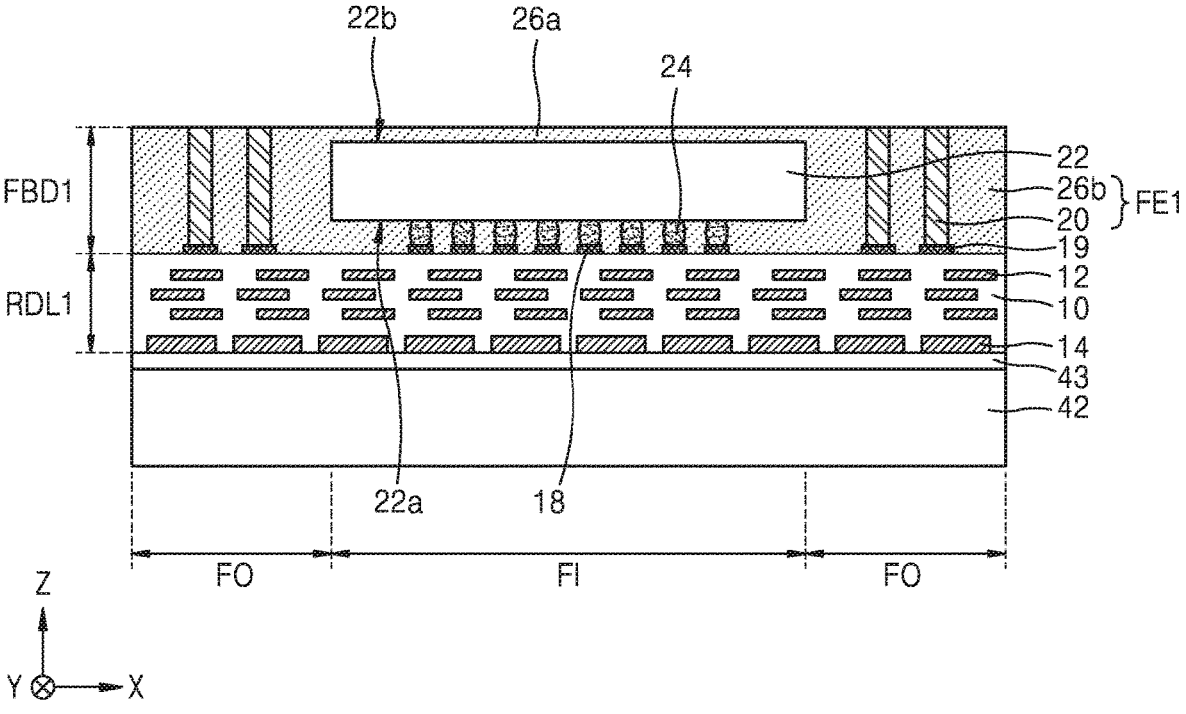

Referring to FIG. 11, the semiconductor chip 22 is mounted in the fan-in region FI. The chip solder ball 24 of the semiconductor chip 22 is electrically connected to the chip connection pad 18 on the first redistribution level layer RDL1.

Next, fan-in and fan-out encapsulation layers 26a and 26b for sealing the semiconductor chip 22 and the inner wiring layer 20 by a sufficient thickness are formed on the first redistribution level layer RDL1. When necessary, the encapsulation layers 26a and 26b may be formed to have the same plane as the inner wiring layer 20 by using a planarization process. For example, top surfaces of the inner wiring layer 20, the fan-in encapsulation layer 26a and the fan-out encapsulation layer 26b are coplanar with each other.

The encapsulation layers 26a and 26b may include the fan-in encapsulation layer 26a sealing the semiconductor chip 22 in the fan-in region FI and the fan-out encapsulation layer 26b scaling the inner wiring layer 20 in the fan-out region FO. The fan-out encapsulation layer 26b sealing the inner wiring layer 20 may be the package element FE1 of the fan-out region FO.

The semiconductor chip 22 in the fan-in region FI, the fan-in encapsulation layer 26a sealing the semiconductor chip 22 in the fan-in region FI, and the package element FE1 including the inner wiring layer 20 and the fan-out encapsulation layer 26b in the fan-out region FO may form the package body level layer FBD1. The chip connection pad 18 and the post connection pad 19 may also be included in the package body level layer FBD1.

Figure 12:
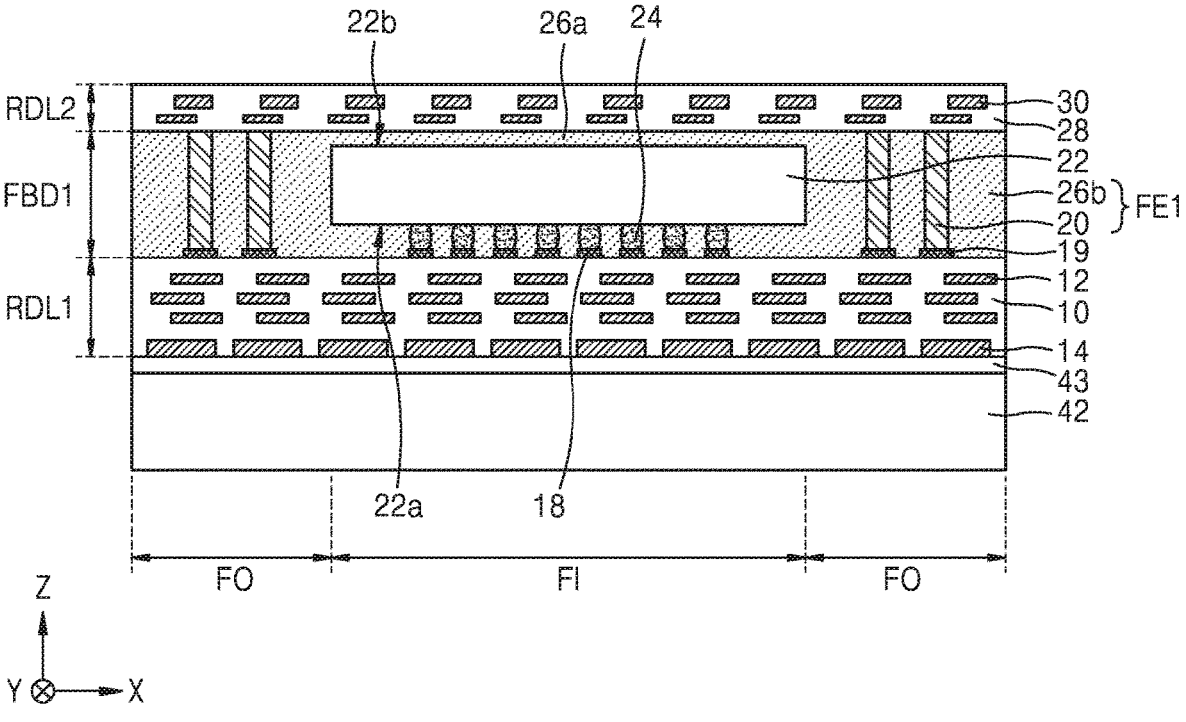

Referring to FIG. 12, the second redistribution level layer RDL2 is formed on the fan-in and fan-out encapsulation layers 26a and 26b and the inner wiring layer 20. The second redistribution level layer RDL2 may be arranged on the upper surface of the package body level layer FBD1 and include the second redistribution layer 30 extending from the fan-in region FI to the fan-out region FO, and the second redistribution insulating layer 28 that insulates the second redistribution layer 30.

Figure 13:
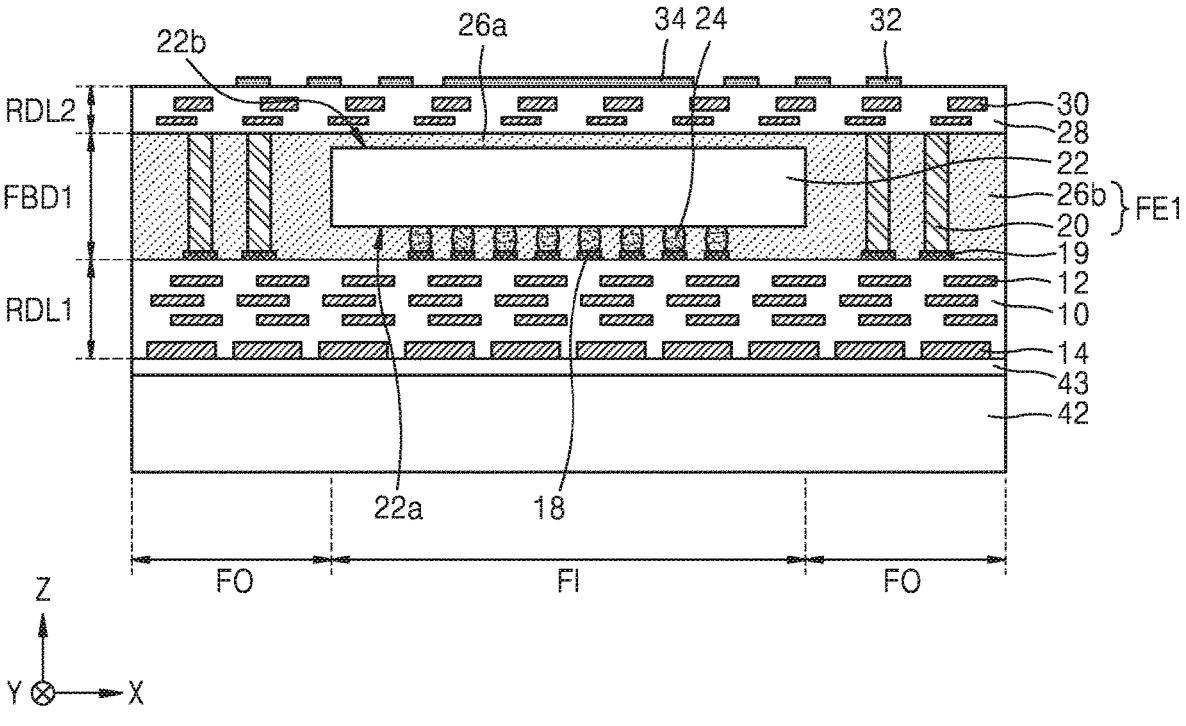

Referring to FIG. 13, the second redistribution pad 32 and the laser mark metal layer 34 are formed on the second redistribution level layer RDL2. After forming a metal material layer on the second redistribution level layer RDL2, the metal material layer is patterned by a photolithography process to form the second redistribution pad 32 and the laser mark metal layer 34.

The laser mark metal layer 34 may be arranged on the second redistribution level layer RDL2 of the fan-in region FI, and spaced apart from the second redistribution pad 32. The second redistribution pad 32 may include a joint pad electrically coupled to an external semiconductor package. The laser mark metal layer 34 may be a dummy metal layer that is not electrically connected to the second redistribution pad 32.

Figure 14:
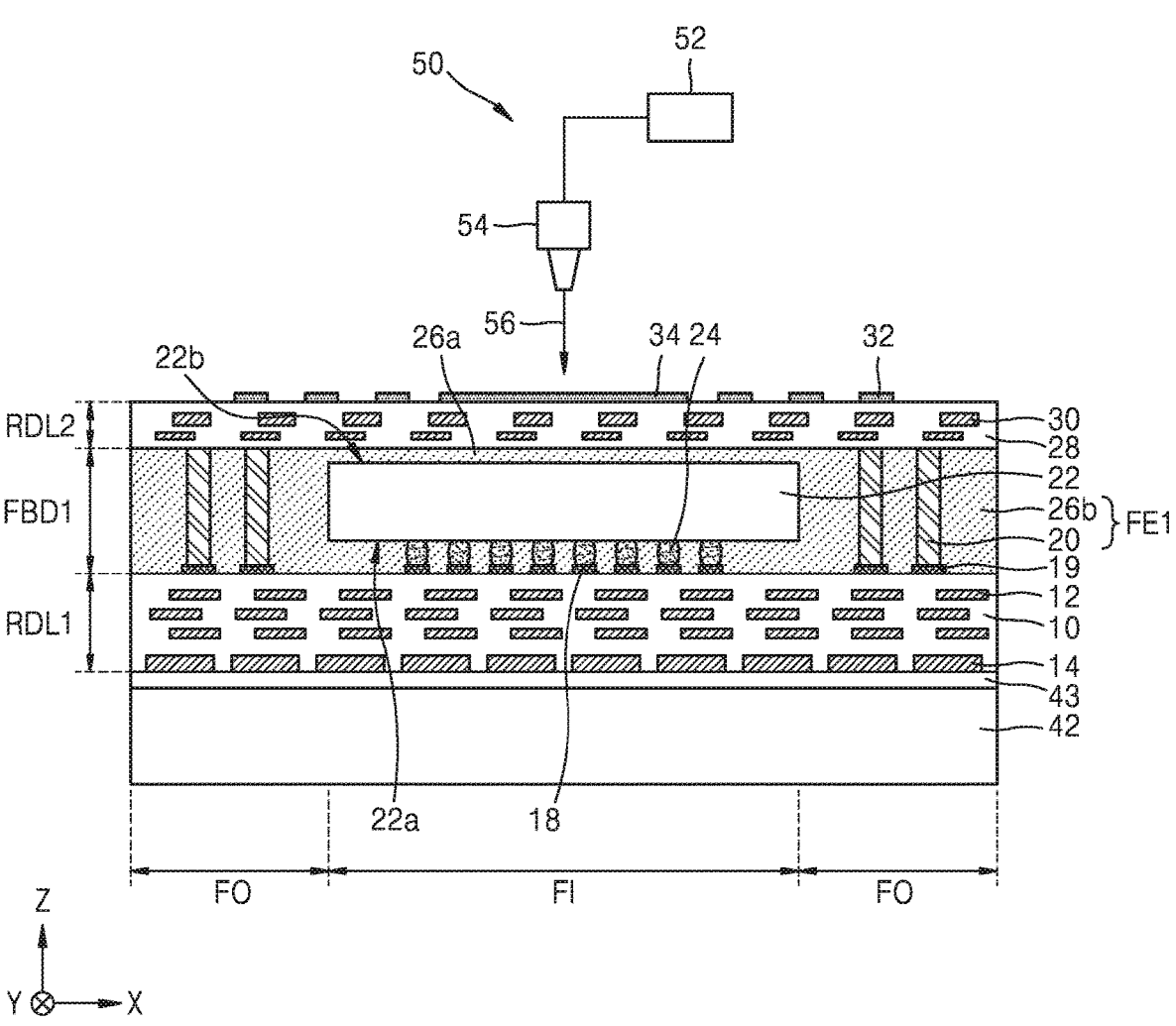

Referring to FIG. 14, a laser mark (36 in FIG. 3A) is formed in the laser mark metal layer 34 by using a laser mark forming apparatus 50. The laser mark forming apparatus 50 includes a control unit 52 and a laser source unit 54. The laser source unit 54 is controlled by the control unit 52 to generate laser 56. The control unit 52 may adjust the wavelength or energy of the laser 56.

In an embodiment of the present inventive concept, the laser 56 may include visible light laser. The laser 56 may be a green laser having a wavelength of about 495 nm to about 570 nm. The laser 56 may be a green laser having a wavelength of 532 nm. In an embodiment of the present inventive concept, the laser 56 may be an ultraviolet laser between about 100 nm and about 400 nm, for example, 355 nm. In an embodiment of the present inventive concept, the laser 56 may have an energy of several Watts.

The laser 56 generated by the laser source unit 54 is applied to the laser mark metal layer 34 while controlling the wavelength or energy thereof, to form a laser mark (36 in FIG. 3A). The laser mark forming apparatus 50 may be moved in the X-direction and the Y-direction to form the laser mark (36 in FIG. 3A) in the plurality of laser mark forming regions (36r1 to 36r6 in FIGS. 4A and 4B) provided in the laser mark metal layer 34.

As described above, as the depth of the circular laser pattern (38 in FIG. 3A) constituting the laser mark 36 is several micrometers (μm), the laser mark 36 may be easily formed by using the laser mark forming apparatus 50 and using a small amount of energy, for example, several Watts. For example, the depth (D1 in FIG. 3A) of the circular laser pattern (38 in FIG. 3A) constituting the laser mark 36 may be precisely controlled by adjusting the applied energy (e.g., adjusting wavelength and/or energy of the laser 56 by the control unit 52) of the laser beam incident onto the laser mark metal layer 34 using the laser mark forming apparatus 50, which includes the control unit 52 and the laser source unit 54.

As described above, the laser mark (36 in FIG. 3A) may include letters, numbers, figures, symbols, recognition codes, etc. indicating various pieces of information of the semiconductor package (PK1 in FIG. 1). As the laser mark 36 of FIG. 3A is formed inside the laser mark metal layer 34 on the second redistribution level layer RDL2, damage to the second redistribution level layer RDL2 may be reduced.

Forming a laser mark on the second redistribution level layer RDL2 may be difficult, because a laser transmits therethrough or a reflectance of the laser is high, and visibility of the laser mark is relatively low. However, in the semiconductor package PK1 (FIG. 1) according to the present inventive concept, the laser mark (36 in FIG. 3A) may be easily formed inside the laser mark metal layer 34, and also, the visibility of the laser mark may be enhanced. Since the laser mark (36 in FIG. 3A) is formed inside the laser mark metal layer 34, the laser may be prevented from reaching the second redistribution insulating layer 28 to cause damage to the second redistribution level layer RDL2.

Figure 15:
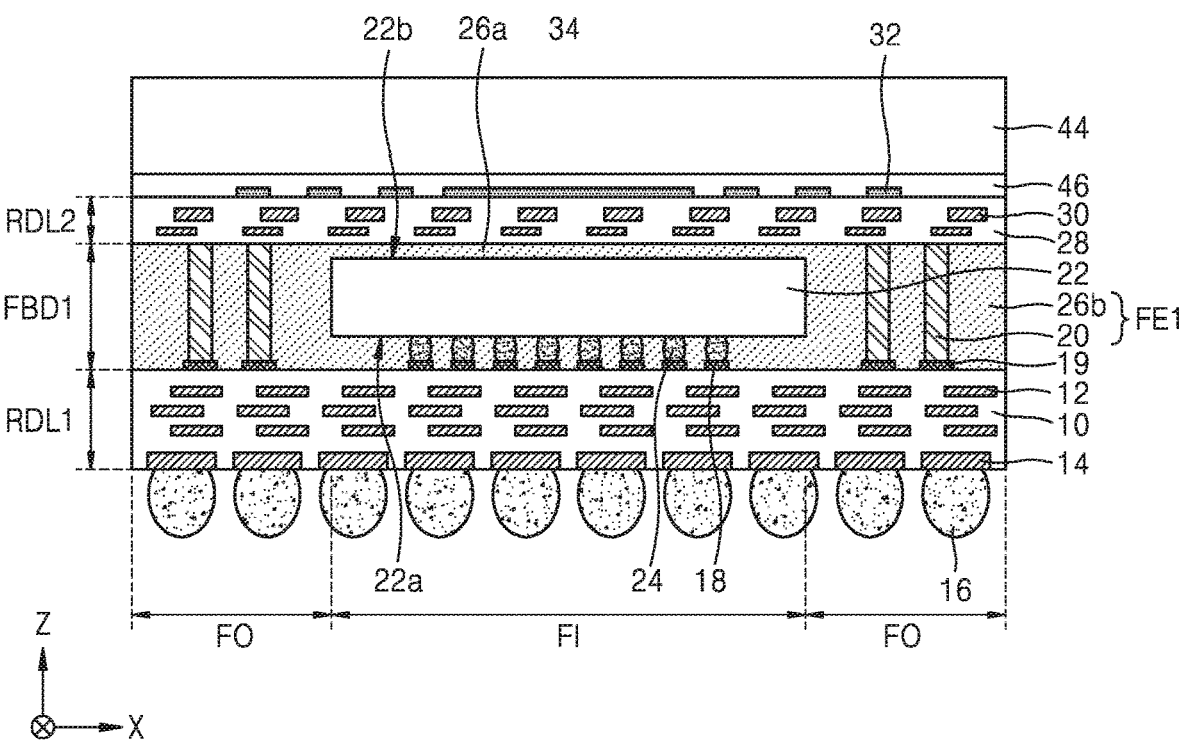

Referring to FIG. 15, after removing the first carrier substrate 42, a second carrier substrate 44 is attached to the second redistribution level layer RDL2 by including an adhesive layer 46 therebetween. In an embodiment of the present inventive concept, the second carrier substrate 44 may include a glass substrate (or glass wafer). In an embodiment of the present inventive concept, the second carrier substrate 44 may include a silicon (Si) substrate (or silicon (Si) wafer).

Next, the first solder ball 16 is formed on the first redistribution pad 14 in a lower portion of the first redistribution level layer RDL1. The first solder ball 16 may include an external connection terminal for connection to an external device. Further, after removing the adhesive layer 46 and the second carrier substrate 44, individual semiconductor packages may be manufactured through a dicing process.

Figure 16:
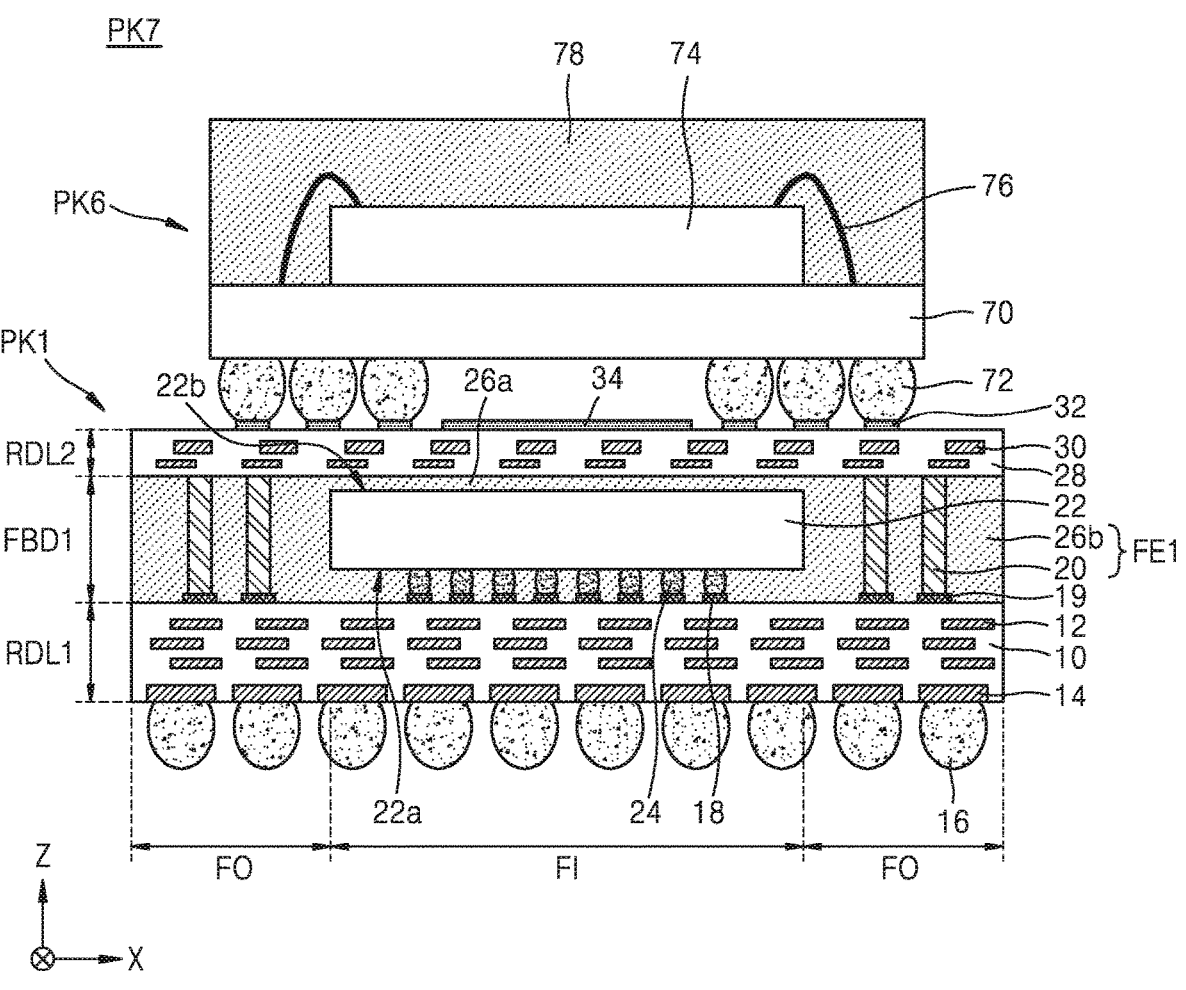
FIG. 16 is a cross-sectional view of a semiconductor package according to an embodiment of the present inventive concept.

FIG. 16 is a cross-sectional view of a semiconductor package according to an embodiment of the present inventive concept.

A semiconductor package PK7 of FIG. 16 may be identical to the semiconductor package PK1 of FIGS. 1, 2, 3A, 3B, 4A, and 4B except that a second semiconductor package PK6 is further stacked therein. In FIG. 16, the same reference numerals as those of FIGS. 1, 2, 3A, 3B, 4A, and 4B denote the same elements.

The semiconductor package PK7 includes the semiconductor package PK1, which may also be referred to as a first semiconductor package, and the second semiconductor package PK6 stacked on the semiconductor package PK1. The semiconductor package PK7 may include a package-on-package (POP)-type package in which a package is stacked on another package. The semiconductor package PK1 is described above, and thus, is briefly described or omitted here.

As described above, in the semiconductor package PK1, the second redistribution pad 32 and the laser mark metal layer 34 are formed on the second redistribution level layer RDL2. Inside the laser mark metal layer 34, a laser mark (36 in FIG. 3A) having information of the semiconductor package PK1 is formed. When manufacturing a POP-type package, a semiconductor package having certain information may be easily selected from among various packages.

The second semiconductor package PK6 is stacked on the second redistribution pad 32 of the semiconductor package PK1. The second semiconductor package PK6 may include a second solder ball 72 formed under a second wiring substrate 70, a second semiconductor chip 74 formed on the second wiring substrate 70, a bonding wire 76 connecting the second semiconductor chip 74 to the second wiring substrate 70, and a second encapsulation layer 78 sealing the second semiconductor chip 74 on the second wiring substrate 70.

The second wiring substrate 70 may include a printed circuit board. The second semiconductor chip 74 may be the same as the semiconductor chip 22 described above. For example, the second semiconductor chip 74 may include, for example, a logic chip, a PMIC chip, or a memory chip.

The second solder ball 72 of the second semiconductor package PK6 may be electrically connected to the second redistribution pad 32. The laser mark metal layer 34 is not electrically connected to the second semiconductor package PK6.

Figure 17:
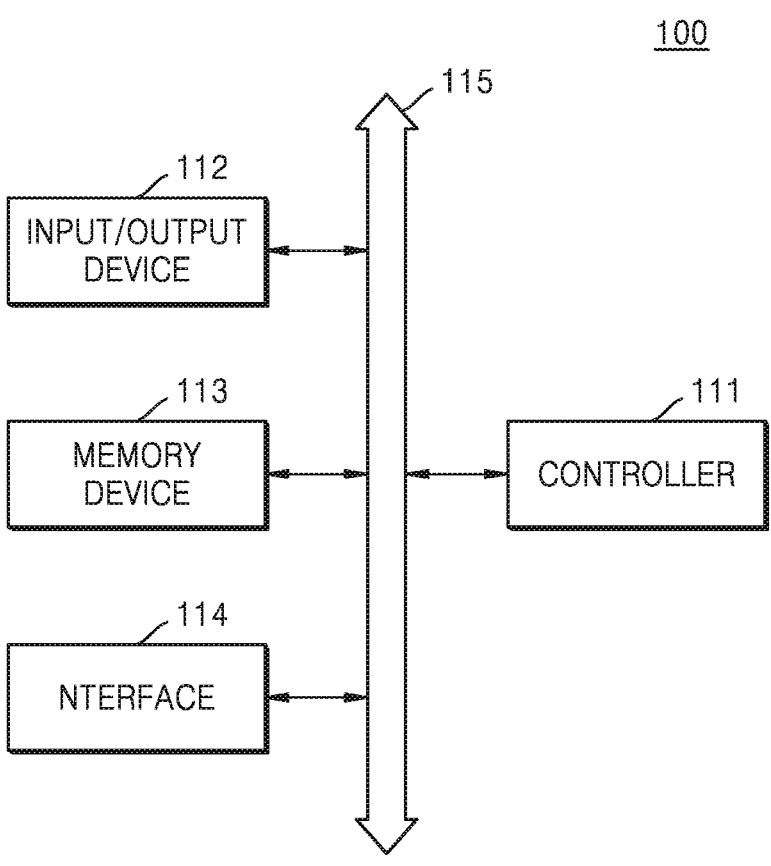
FIG. 17 is a schematic block diagram illustrating an example of a memory system having a semiconductor package, according to an embodiment of the present inventive concept.

FIG. 17 is a schematic block diagram illustrating an example of a memory system having a semiconductor package, according to an embodiment of the present inventive concept.

Referring to FIG. 17, a memory system 100 may be applied to, for example, a personal digital assistant (PDA), a portable computer, a web tablet, a wireless phone, a mobile phone, a digital music player, a memory card, or any device capable of transmitting and/or receiving information in a wireless environment.

The memory system 100 includes a controller 111, an input/output device 112 such as, for example, a keypad, a keyboard, or a display, a memory device (or memory chip) 113, an interface 114, and a bus 115. The memory device 113 and the interface 114 communicate with each other via a bus 115.

The controller 111 includes at least one microprocessor, a digital signal processor, a microcontroller, or other processing devices similar thereto. The memory device 113 may be used to store a command executed by the controller 111. The input/output device 112 may receive data or signals from outside the memory system 100 or may output data or signals to the outside of the memory system 100. For example, the input/output (I/O) device 112 may include, for example, a keyboard, a keypad, or a display device.

The memory device 113 and the controller 111 may include the semiconductor packages PK1 to PK7 according to the embodiments of the present inventive concept. The memory device 113 may further include other types of memories, volatile memories that can be accessed at any time, and other various types of memories. The interface 114 has a function of transmitting data to a communication network or receive data from a communication network.

Figure 18:
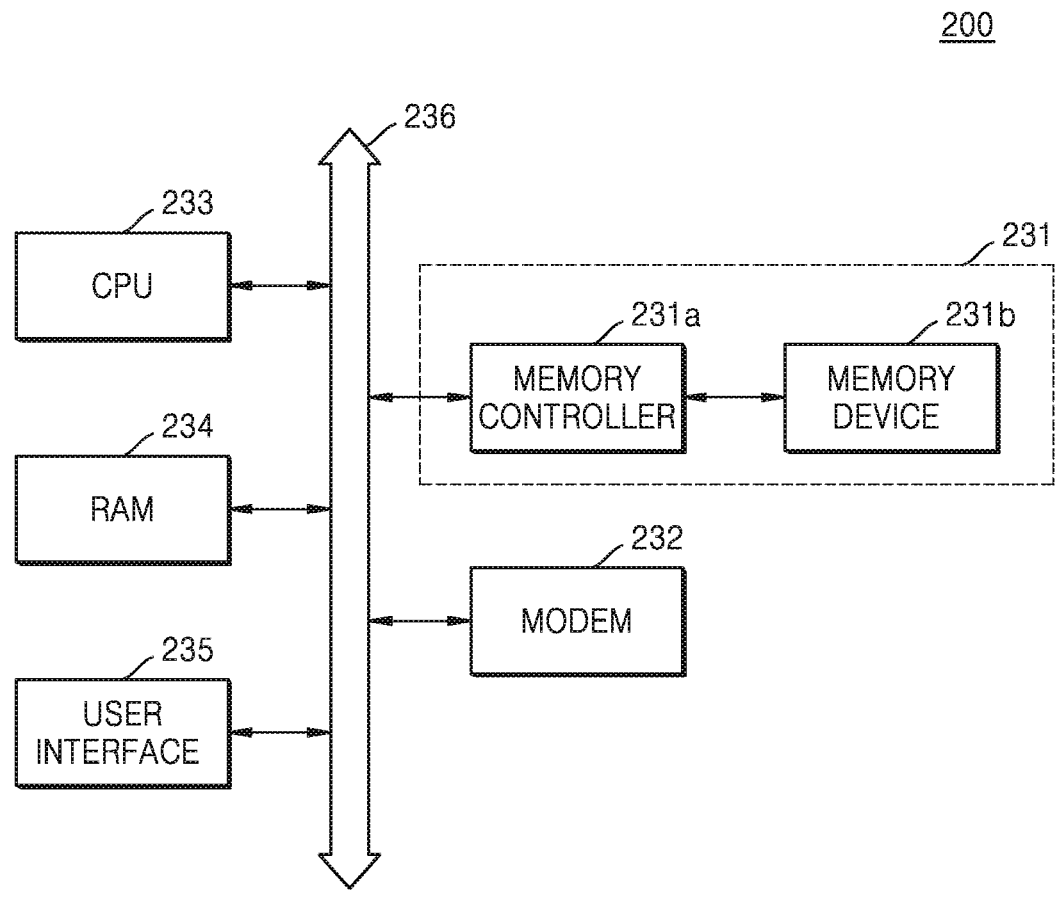
FIG. 18 is a schematic block diagram illustrating an example of an information processing system having a semiconductor package, according to an embodiment of the present inventive concept.

FIG. 18 is a schematic block diagram illustrating an example of an information processing system having a semiconductor package, according to an embodiment of the present inventive concept.

Referring to FIG. 18, an information processing system 200 may be used in, for example, a mobile device or a desktop computer. The information processing system 200 may include a memory system 231 including a memory controller 231a and a memory device 231b.

Information processing system 200 includes the memory system 231, a modem 232 (MOdulator and DEModulator: MODEM), a CPU 233, a RAM 234, and a user interface 235 that are electrically connected to a system bus 236. Data processed by the CPU 233 or data input from the outside is stored in the memory system 231.

The memory system 231 including the memory controller 231a and the memory device 231b, the modem 232, the central processing unit 233, and the RAM 234 may include the semiconductor packages PK1 to PK7 according to the embodiments of the present inventive concept.

The memory system 231 may be configured as a solid state drive, and in this case, the information processing system 200 may stably store a large amount of data in the memory system 231. In addition, as reliability of the memory system 231 increases, the memory system 231 may have reduced resources required for error correction, thereby providing a high-speed data exchange function to the information processing system 200.

The information processing system 200 may further include an application chipset, a camera image signal processor (ISP), an input/output device, and/or the like.

While the present inventive concept has been particularly shown and described with reference to embodiments thereof, it will be understood that various changes in form and details may be made therein without departing from the spirit and scope of the present inventive concept as defined in the appended claims.

What is claimed is:

1. A semiconductor package comprising:
an encapsulation layer sealing at least one semiconductor chip;
a redistribution level layer arranged on the encapsulation layer;
a laser mark metal layer arranged on the redistribution level layer; and
a laser mark arranged inside the laser mark metal layer, wherein the laser mark metal layer comprises a plurality of sub-metal layers stacked on top of each other.

2. The semiconductor package of claim 1, wherein the redistribution level layer comprises:
a redistribution layer; and
a redistribution insulating layer insulating the redistribution layer.

3. The semiconductor package of claim 1, wherein the laser mark metal layer is arranged on a portion of an entire surface of the redistribution level layer.

4. The semiconductor package of claim 1, further comprising a redistribution pad that is arranged on the redistribution level layer and is apart from the laser mark metal layer on a level the same as that of the laser mark metal layer.

5. The semiconductor package of claim 4, wherein the laser mark metal layer comprises a dummy metal layer that is not electrically connected to the redistribution pad.

6. The semiconductor package of claim 1, wherein the laser mark has a depth of several micrometers into the laser mark metal layer in a cross-section.

7. The semiconductor package of claim 1, wherein the laser mark comprises a circular laser pattern or an elliptical laser pattern, formed into the laser mark metal layer in a cross-section.

8. The semiconductor package of claim 1, wherein the plurality of sub-metal layers comprises a first sub-metal layer and a second sub-metal layer made of different materials.

9. The semiconductor package of claim 1, wherein in a top plan view, the laser mark metal layer is disposed inside of the at least one semiconductor chip and the laser mark is disposed inside of the laser mark metal layer.

10. A semiconductor package comprising:

a fan-in region in which a semiconductor chip is located, and a fan-out region surrounding the fan-in region and comprising a package element including an inner wiring layer;

a package body level layer comprising a fan-in encapsulation layer sealing the semiconductor chip in the fan-in region;

a first redistribution level layer arranged on a lower surface of the package body level layer and comprising a first redistribution layer and a first redistribution insulating layer, wherein the first redistribution layer extends from the fan-in region to the fan-out region, and the first redistribution insulating layer insulates the first redistribution layer;

a second redistribution level layer arranged on an upper surface of the package body level layer and comprising a second redistribution layer and a second redistribution insulating layer, wherein the second redistribution layer extends from the fan-in region to the fan-out region, and the second redistribution insulating layer insulates the second redistribution layer;

a laser mark metal layer arranged on the second redistribution level layer; and a laser mark arranged inside the laser mark metal layer, wherein the laser mark metal layer comprises a plurality of sub-metal layers stacked on top of each other, and the plurality of sub-metal layers comprises a first sub-metal layer and a second sub-metal layer made of different materials.

11. The semiconductor package of claim 10, wherein the package element comprises a wiring substrate having a through hole therein.

12. The semiconductor package of claim 10, wherein the package element further includes a fan-out encapsulation layer sealing the inner wiring layer of the fan-out region.

13. The semiconductor package of claim 10, wherein the laser mark metal layer is arranged on a portion of an entire surface of the second redistribution level layer of the fan-in region.

14. The semiconductor package of claim 10, further comprising a redistribution pad that is arranged on the second redistribution level layer and is apart from the laser mark metal layer on a level the same as that of the laser mark metal layer.

15. The semiconductor package of claim 10, wherein the laser mark has a depth of several micrometers into the laser mark metal layer in a cross-section, and the laser mark comprises a circular laser pattern or an elliptical laser pattern, formed inside the laser mark metal layer in a cross-section.

16. A semiconductor package comprising:

a fan-in region in which a semiconductor chip is located, and a fan-out region surrounding the fan-in region and including an inner wiring layer;

a package body level layer comprising an encapsulation layer sealing the semiconductor chip in the fan-in region and the inner wiring layer in the fan-out region;

a first redistribution level layer arranged on a lower surface of the package body level layer and comprising a first redistribution layer and a first redistribution insulating layer, wherein first redistribution layer extends from the fan-in region to the fan-out region, and the first redistribution insulating layer insulates the first redistribution layer;

a second redistribution level layer arranged on an upper surface of the package body level layer and comprising a second redistribution layer and a second redistribution insulating layer, wherein the second redistribution layer extends from the fan-in region to the fan-out region, and the second redistribution insulating layer insulates the second redistribution layer;

a laser mark metal layer arranged on the second redistribution level layer in the fan-in region and configured to have a plurality of sub-metal layers; and a laser mark arranged on the laser mark metal layer, wherein in a top plan view, the laser mark metal layer is disposed inside of the semiconductor chip and the laser mark is disposed inside of the laser mark metal layer.

17. The semiconductor package of claim 16, wherein the laser mark metal layer is arranged on a portion of an entire surface of the second redistribution level layer of the fan-in region.

18. The semiconductor package of claim 16, further comprising a redistribution pad that is arranged on the second redistribution level layer on a level the same as that of the laser mark metal layer and is apart from the laser mark metal layer, wherein the laser mark metal layer comprises a dummy metal layer that is not electrically connected to the redistribution pad.

19. The semiconductor package of claim 16, wherein the laser mark metal layer comprises first to third sub-metal layers formed on the second redistribution level layer in a cross-section, the laser mark comprises a circular laser pattern or an elliptical laser pattern, formed in the first to third sub-metal layers in a cross-section, and a bottom of the circular or elliptical laser pattern constituting the laser mark is located inside the first sub-metal layer, on a bottom of the second sub-metal layer, or on a bottom of the third sub-metal layer.

20. The semiconductor package of claim 16, wherein the laser mark metal layer comprises first and second sub-metal layers sequentially formed on the second redistribution level layer in a cross-section, the laser mark comprises a circular laser pattern or an elliptical laser pattern, formed in the first and second sub-metal layers in a cross-section, and a bottom of the circular or elliptical laser pattern constituting the laser mark is located inside the first sub-metal layer.

* * * * *